United States Patent
Fukui et al.

(10) Patent No.: US 12,005,510 B2
(45) Date of Patent: Jun. 11, 2024

(54) CUTTING TOOL

(71) Applicant: Sumitomo Electric Industries, Ltd., Osaka (JP)

(72) Inventors: Haruyo Fukui, Osaka (JP); Nozomi Tsukihara, Osaka (JP); Anongsack Paseuth, Osaka (JP); Toshihiro Tabata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/039,969

(22) PCT Filed: Oct. 14, 2022

(86) PCT No.: PCT/JP2022/038392
§ 371 (c)(1),
(2) Date: Jun. 2, 2023

(65) Prior Publication Data
US 2024/0123514 A1  Apr. 18, 2024

(51) Int. Cl.
*B23B 27/14* (2006.01)
*C23C 14/06* (2006.01)
*C23C 28/00* (2006.01)

(52) U.S. Cl.
CPC ........ *B23B 27/148* (2013.01); *C23C 14/0641* (2013.01); *C23C 14/0664* (2013.01); *C23C 28/42* (2013.01); *C23C 28/44* (2013.01)

(58) Field of Classification Search
None
See application file for complete search history.

(56) References Cited

U.S. PATENT DOCUMENTS

2005/0227116 A1* 10/2005 Takaoka .............. C23C 14/0664
  427/580
2021/0016361 A1* 1/2021 Kinoshita ............... C23C 28/42

FOREIGN PATENT DOCUMENTS

| JP | H09-300105 A | 11/1997 |
| JP | 2004-269985 A | 9/2004 |
| JP | 2005-022023 A | 1/2005 |
| JP | 2017-064845 A | 4/2017 |

OTHER PUBLICATIONS

International Search Report and Written Opinion dated Dec. 20, 2022, received for PCT Application PCT/JP2022/038392, filed on Oct. 14, 2022, 12 pages including English Translation.

* cited by examiner

*Primary Examiner* — Seth Dumbris
(74) *Attorney, Agent, or Firm* — XSENSUS LLP

(57) ABSTRACT

A cutting tool is a cutting tool comprising a substrate and a coating film disposed on the substrate, in which the coating film includes a first layer, the first layer is composed of an alternate layer where a first unit layer and a second unit layer are alternately stacked, the first unit layer is composed of $Al_aCr_{1-a-b}Ce_bN$, a is more than 0.500 and 0.800 or less, b is 0.001 or more and 0.100 or less, the second unit layer is composed of $Al_cV_{1-c}N$, c is 0.30 or more and 0.75 or less, and a and c satisfy a relationship of a>c.

16 Claims, 7 Drawing Sheets

CUTTING TOOL

CROSS-REFERENCE TO RELATED APPLICATIONS

The present application is based on PCT/JP2022/038392, filed Oct. 14, 2022, the entire contents of which is incorporated herein by reference.

TECHNICAL FIELD

The present disclosure relates to a cutting tool.

BACKGROUND ART

A cutting tool comprising a substrate and a coating film disposed on the substrate has been conventionally used for cutting machining (PTL. 1 and PTL. 2).

CITATION LIST

Patent Literature

PTL 1: Japanese Patent Laying-Open No. 2017-64845
PTL 2: Japanese Patent Laying-Open No. H9-300105

SUMMARY OF INVENTION

A cutting tool according to one aspect of the present disclosure is a cutting tool comprising a substrate and a coating film disposed on the substrate, wherein
  the coating film includes a first layer,
  the first layer is composed of an alternate layer where a first unit layer and a second unit layer are alternately stacked
  the first unit layer is composed of $Al_aCr_{1-a-b}Ce_bN$,
  a is more than 0.400 and 0.800 or less,
  b is 0.001 or more and 0.100 or less,
  the second unit layer is composed of $Al_cV_{1-c}N$,
  c is 0.40 or more and 0.75 or less, and
  a and c satisfy a relationship of a>c.

DETAILED DESCRIPTION

Figure 1:
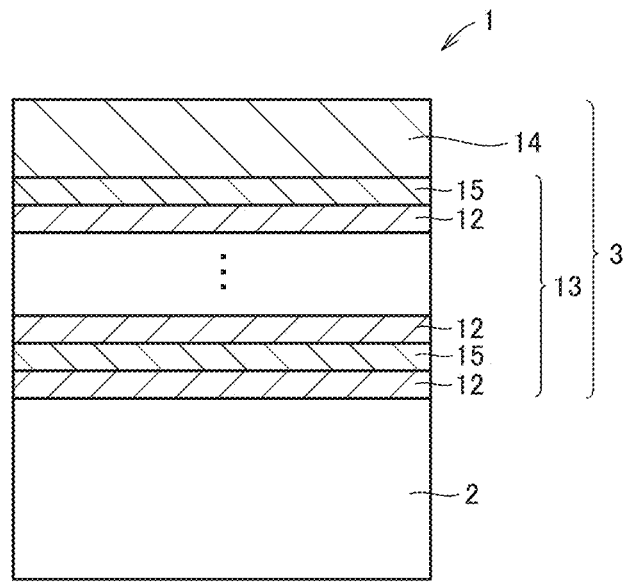
FIG. 1 is a schematic enlarged cross-sectional view of one example of a cutting tool according to Embodiment 1.

Problem to be Solved by the Present Disclosure

Cutting machining plays a key role among manufacturing techniques, and always continues to be demanded to be technically advanced and highly developed. Cutting machining techniques have been basically demanded to be increased in speed and efficiency and increased in accuracy. Cutting of workpieces has been made difficult as recent trends, and responses thereto have also been demanded.

Additionally, SDGs (Sustainable Development Goals) have recently attracted increasing attention in a cutting machining setting in order to realize a sustainable and better world by 2030. The sustainable development means the construction of social infrastructure that not only causes no loss of resources required by future generations, but also can withstand natural threats. An enhancement in cutting machining technique is expected to lead to environmental load reductions, for example, power saving in product manufacturing due to a reduction in manufacturing process and a decrease in waste according to cutting machining. For cutting tools, there has been targeted development of various types of coating tool materials that are high in high-temperature hardness for an increase in tool life and that have both hardness and toughness.

Conventionally, a substrate surface has been covered with a nitride or carbonitride coating film containing Ti and Al as main components, as the type of a coating tool material (PTL 1 and PTL 2). However, the cutting edge temperature of a cutting tool in cutting tends to be higher because of, for example, a demand for dry machining with no cutting oil from the viewpoint of SDGs and global environmental conservation, an increase in cutting speed for an enhancement in machining efficiency, and an increase in cutting of a heat-resistant alloy, a titanium alloy and the like each called hard-to-cut material, particularly in the fields of airplane and medical care due to diversity of a workpiece. A higher cutting edge temperature causes an extremely shorter life of a cutting tool. Accordingly, there is a demand for a cutting tool than can exhibit an excellent tool life even under such severe cutting conditions.

Advantageous Effect of the Present Disclosure

According to the present disclosure, a cutting tool having a long tool life particularly even in cutting machining to be carried out under a high cutting edge temperature condition can be provided.

Description of Embodiments

First, embodiments of the present disclosure will be listed and described.

(1) A cutting tool according to one aspect of the present disclosure is a cutting tool comprising a substrate and a coating film disposed on the substrate, wherein
  the coating film includes a first layer,
  the first layer is composed of an alternate layer where a first unit layer and a second unit layer are alternately stacked,
  the first unit layer is composed of $Al_aCr_{1-a-b}Ce_bN$,
  a is more than 0.400 and 0.800 or less,
  b is 0.001 or more and 0.100 or less, the second unit layer is composed of $Al_cV_{1-c}N$, c is 0.40 or more a 0.75 or less, and a and c satisfy a relationship of a>c.

According to the present disclosure, a cutting tool having a long tool life particularly even in cutting machining to be carried out under a high cutting edge temperature condition can be provided.

(2) In (1) described above, in the first unit layer and the second unit layer adjacent to the first unit layer, a ratio $\lambda 1/\lambda 2$ of a thickness $\lambda 1$ of the first unit layer to a thickness $\lambda 2$ of the second unit layer may be 1.0 or more and 5.0 or less. Thus, the cutting tool can have a longer tool life.

(3) In (1) or (2) described above, an average thickness of the first unit layer may be 0.002 μm or more and 0.2 μm or less, and an average thickness of the second unit layer may be 0.002 μm or more and 0.2 μm or less.

Thus, the cutting tool can have a long tool life.

(4) In any of (1) to (3) described above, the costing film may further include a second layer disposed between the substrate and the first layer, and a composition of the second layer may be the same as a composition of the first unit layer or a composition of the second unit layer.

Thus, the cutting tool can have a longer tool life.

(5) In (4) described above, the composition of the second layer may be the same as the composition of the first unit layer, and a thickness of the second layer may be larger than a thickness of the first unit layer.

Thus, the cutting tool can have a longer tool life (6) In (4) described above, the composition of the second layer may be the same as the composition of the second unit layer, and a thickness of the second layer may be larger than a thickness of the second unit layer.

Thus, the cutting tool can have a longer tool life.

(7) in (1) to (6) described above, the coating film may further include a third layer provided on the first layer opposite to the substrate, and the third layer may be composed of AlCrCeCN.

Thus, the cutting tool can have a longer tool life.

(8) A cutting tool according to another aspect of the present disclosure is a cutting tool comprising a substrate and a coating film disposed on the substrate, wherein the coating film includes a first A layer, the first A layer is composed of an alternate layer where a first unit layer and a third unit layer are alternately stacked, the first unit layer is composed of $Al_aCr_{1-a-b}Ce_bN$, a is more than 0.400 and 0.800 or less, b is 0.001 or more and 0.100 or less, the third unit layer is composed of $Al_dV_{1-d-e}M_eN$, M is silicon or boron, d is 0.40 or more and 0.75 or less, e is more than 0 and 0.05 or less, and a and d satisfy a relationship of a>d.

According to the present disclosure, a cutting tool having a long tool life particularly even in cutting machining to be carried out under a high cutting edge temperature condition can be provided.

(9) In (8) described above, in the first unit layer and the third unit layer adjacent to the first unit layer, a ratio $\lambda 1/\lambda 3$ of a thickness $\lambda 1$ of the first unit layer to a thickness $\lambda 3$ of the third unit layer may be 1.0 or more and 5.0 or less.

Thus, the cutting tool can have a longer tool life.

(10) In (8) or (9) described above, M may be silicon.

Thus, the cutting tool can have a longer tool life

(11) In (8) or (9) described above, M may be boron.

Thus, the cutting tool can have a longer tool life.

(12) In any of (8) to (11) described above, an average thickness of the first unit layer may be 0.002 μm or more and 0.2 μm or less, and an average thickness of the third unit layer may be 0.002 μm or more and 0.2 μm or less.

Thus, the cutting tool can have a longer tool life.

(13) In any of (8) to (12) described above, the coating film may further include a second layer disposed between the substrate and the first A layer, and a composition of the second layer may be the same as a composition of the first unit layer or a composition of the third unit layer.

Thus, the cutting tool can have a longer tool life.

(14) In (13) described above, the composition of the second layer may be the same as the composition of the first unit layer, and a thickness of the second layer may be larger than a thickness of the first unit layer.

Thus, the cutting tool can have a longer tool life.

(15) In (13) described above, the composition of the second layer may be the same as the composition of the third unit layer, and a thickness of the second layer may be larger than a thickness of the third unit layer.

Thus, the cutting tool can have a longer tool life.

(16) In any of (8) to (15) described above, the coating film may further include a third layer provided on the first A layer opposite to the substrate, and the third layer may be composed of AlCrCeCN.

Thus, the cutting tool can have a longer tool life

DETAIL OF EMBODIMENTS OF THE PRESENT DISCLOSURE

Specific examples of a cutting tool of the present disclosure are described below with reference to drawings. The same reference symbol in the drawings in the present disclosure represents the same section or any corresponding section thereof. A dimensional relationship among a length, a width, a thickness, a depth, and the like is appropriately modified for clarification and simplification of the drawings, and does not necessarily represent an actual dimensional relationship.

The designation "A to B" in the present disclosure means to include the upper limit and the lower limit of a range (namely, A or more and B or less), and when no unit is designated with A and any unit is designated with only B, the unit of A is the same as the unit of B.

When a compound or the like is represented by a chemical formula in the present disclosure, the atomic ratio thereof, if not particularly limited, encompasses any atomic ratio conventionally known, and should not be necessarily limited to only any ratio falling within the stoichiometric range. For example, when "AlCrCeN" is designated, the ratio of the numbers of atoms constituting AlCrCeN encompasses any atomic ratio conventionally known.

When one or more numbers with respect to each of the lower limit and the upper limit of a number range in the present disclosure are designated, a combination of any one number designated as the lower limit and any one number designated as the upper limit is also disclosed. For example, when a1 or more, b1 or more, or c1 or more is designated as the lower limit and a2 or less, b2 or less, or c2 or less is designated as the upper limit, a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less are disclosed.

Embodiment 1: Cutting Tool (1)

A cutting tool according to one embodiment of the present disclosure is described with reference to FIG. 1 to FIG. 5.

A cutting tool 1 according to one embodiment of the present disclosure (hereinafter, also designated as "Embodiment 1") is cutting tool 1 comprising a substrate 2 and a coating film 3 disposed on substrate 2, wherein
coating film 3 includes a first layer 13,
first layer 13 is composed of an alternate layer where a first unit layer 12 and a second unit layer 15 are alternately stacked,
first unit layer 12 is composed of $Al_aCr_{1-a-b}Ce_bN$,
a is more than 0.400 and 0.800 or less,
b is 0.001 or more and 0.100 or less,
second unit layer 15 is composed of $Al_cV_{1-c}N$,
c is 0.40 or more and 0.75 or less, and
a and c satisfy a relationship of a>c.

Cutting tool 1 of Embodiment 1 can have a long cool life particularly even in cutting machining to be carried out under a high cutting edge temperature. The reason for this is presumed as follows.

(a1) First unit layer 12 is composed of a nitride containing Al, Cr and Ce. Al is easily oxidized and therefore a dense oxide layer composed of $Al_2O_3$ is easily formed on a surface of coating film 3 of first unit layer 12. Furthermore, Ce is low in standard energy of formation of oxide as compared with Al, and thus more easily oxidized and more easily forms a dense oxide layer composed of $CeO_2$ on a surface of coating film 3 of first unit layer 12 than Al. Such an oxide layer can enhance oxidation resistance of coating film 3, can decrease reactivity with a workpiece and can reduce the coefficient of friction with a workpiece. Accordingly, cutting tool 1 comprising coating film 3 can achieve a long life under severe machining conditions where the cutting edge temperature is easily increased, including dry machining, and machining of a hard-to-cut material.

(b1) The lattice constant of CeN is 5.01 Å, and is larger than 4.15 Å being the lattice constant of $C_3N$ and 4.12 Å being the lattice constant of AlN. Therefore, strain is introduced to first unit layer 12 composed of cubic $Al_aCr_{1-a-b}Ce_bN$ formed with addition of Ce, and first unit layer 12 is enhanced in hardness and wear resistance and cutting tool 1 comprising first unit layer 12 is increased in life.

(c1) Second unit layer 15 is composed of a nitride containing Al and V. A layer including Al, V and N is excellent in balance among heat insulation resistance, oxidation resistance and toughness. Accordingly, the second unit layer can contribute to an increase in life of a surface-covered cutting tool.

(d1) When a layer composed of a nitride containing Al, Cr and Ce (hereinafter, also designated as "AlCrCeN layer".) and a layer composed of a nitride containing Al and V (hereinafter, also designated as "AlVN layer".) are compared, the AlCrCeN layer hardly leads to spinodal decomposition at high temperature. If spinodal decomposition occurs, soft hexagonal AlN is precipitated to cause deterioration in hardness. The AlCrCeN layer has the properties of being suppressed in deterioration in hardness at high temperature, being large in compressive residual stress, and being excellent in chipping resistance. The AlVN layer has the properties of being small in compressive residual stress and being high in heat insulation ability. The AlVN layer is oxidized in cutting to produce $V_2O_3$ as a oxide of V. The melting point of $V_2O_3$ is 690° C. and thus is softened and functions as a lubricant at a temperature during cutting machining, and a reduction of coefficient of friction on a rake face of the tool can be achieved. First layer 13 is composed of an alternate layer where first unit layer 12 composed of the AlCrCeN layer and second unit layer 15 composed of the AlVN layer are alternately stacked, and thus can have the properties of high hardness due to first unit layer 12 and high heat insulation ability due to second unit layer 15. The property of small compressive residual stress due to second unit layer 15 is complemented with large compressive residual stress due to first unit layer 12. Accordingly, first layer 13 is entirely enhanced in hardness, heat insulation ability and compressive residual stress in a well-balanced manner, and the life of cutting tool 1 comprising first layer 13 is increased.

(e1) First layer 13 is composed of an alternate layer where first unit layer 12 and second unit layer 15 are alternately stacked. The composition and the crystal lattice are discontinuous at the interface between first unit layer 12 and second unit layer 15. Therefore, when cracks occur from a surface of coating film 3 in cutting, crack development can be suppressed at the interface. Accordingly, chipping and breakage are suppressed and the life of cutting tool 1 is increased.

(f1) First unit layer 12 is composed of $Al_aCr_{1-a-b}Ce_bN$, second unit layer 15 is composed of $Al_cV_{1-c}N$, and a and c satisfy a relationship of a>c. First unit layer 12 tends to be easily high in content of Al as compared with second unit layer 15. The content of Al in first unit layer 12 can be high to result in an increase in content of Al contained in entire first layer 13. As a result, heat insulation ability and oxidation resistance of first layer 13 can be enhanced and the life of cutting tool 1 comprising first layer 13 is increased.

<Cutting Tool>

Figure 2:
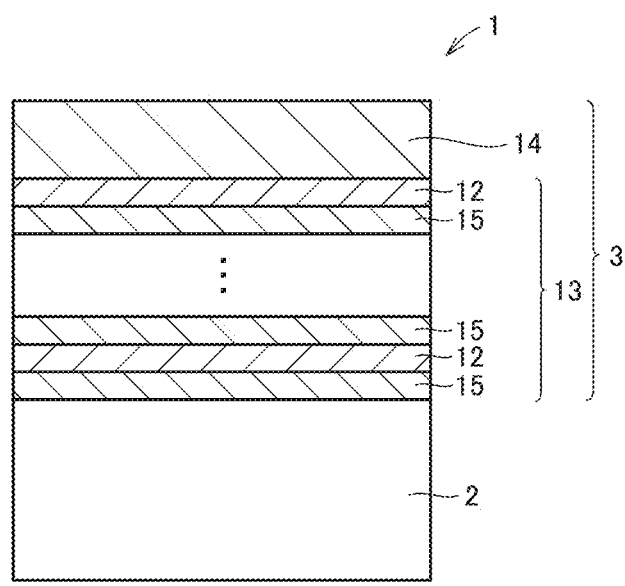
FIG. 2 is a schematic enlarged cross-sectional view of one example of a cutting tool according to Embodiment 1.

As illustrated in FIG. 1 and FIG. 2, cutting tool 1 according to one embodiment of the present invention includes substrate 2, and coating film 3 disposed on substrate 2. Coating film 3 may cover the entire face of substrate 2. A case where one portion of substrate 2 is not covered with coating film 3 and a case where the configuration of coating film 3 is partially different also do not depart from the scope of the present embodiment. Coating film 3 may cover at least a portion of substrate 2, the portion involving in cutting. Herein, the portion of substrate 2, involving in cutting, means, while depends on the size and shape of substrate 2, a region of substrate 2, the region being surrounded by a cutting edge ridgeline, and a virtual face where the distance from the cutting edge ridgeline toward substrate 2 along with the perpendicular line of the tangent to the cutting edge ridgeline is, for example, any of 5 mm, 3 mm, 2 mm, 1 mm, and 0.5 mm.

Cutting tool 1 of the present embodiment can be suitably used as cutting tool 1 for drills, end mills, indexable cutting inserts for drills, indexable cutting inserts for end mills, indexable cutting inserts for milling, indexable cutting inserts for turning, metal saws, gear cutting tools, reamers, taps, and the like.

<Substrate>

Any substrate conventionally known can be used as substrate 2. For example, substrate 2 may be composed of any of cemented carbide (WC-based cemented carbide, cemented carbide containing WC and Co, cemented carbide where carbonitride of Ti, Ta, Nb or the like is added to WC and Co, or the like), cermet (one containing TiC, TiN, TiCN or the like as a main component), high-speed steel, ceramics (titanium carbide, silicon carbide, silicon nitride, aluminum nitride, aluminum oxide, or the like), a cubic boron nitride sintered material, or a diamond sintered material.

Substrate 2 may be particularly WC-based cemented carbide or cermet (in particular, TiCN-based cermet). WC-based cemented carbide or cermet is excellent in balance between hardness and strength particularly at high temperature, and thus, when used as substrate 2 of cutting tool 1, can contribute to an increase in life of cutting tool 1.

<Costing Film>

Figure 3:
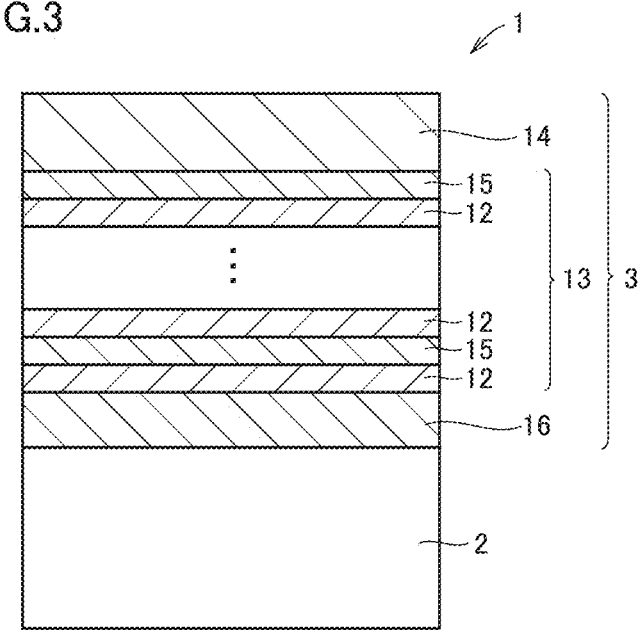
FIG. 3 is a schematic enlarged cross-sectional view of one example of a cutting tool according to Embodiment 1.
Figure 4:
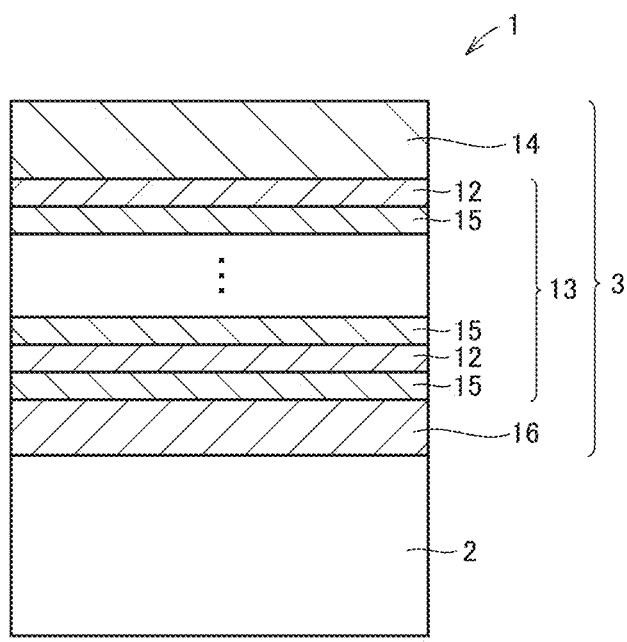
FIG. 4 is a schematic enlarged cross-sectional view of one example of a cutting tool according to Embodiment 1.

Coating film 3 of Embodiment 1 includes first layer 13. Coating film 3 covers substrate 2, and thus has the action of enhancing various characteristics such as wear resistance and chipping resistance of cutting tool 1 and resulting in an increase in life of cutting tool 1. Herein, coating film 3 can include, in addition to first layer 13, other layer. Examples of such other layer include, as illustrated in FIG. 3 and FIG. 4, a second layer 16 disposed between substrate 2 and first layer 13, and a third layer 14 provided on first layer 13 opposite to substrate 2.

The entire thickness of coating film 3 may be 0.5 μm or more and 15 μm or less. If the entire thickness of coating film 3 is 0.5 μm or more, the effect of increasing the life of cutting tool 1 due to coating film 3 provided is easily obtained. On the other hand, if the entire thickness of coating film 3 is 15 μm or less, chipping in coating film 3 hardly occurs in an early stage of cutting, and the life of cutting tool 1 can be increased. The entire thickness of coating film 3 can be measured by observation of a cross section of coating film 3 with scanning electron microscope (SEM). A specific measurement method is as follows. Cutting tool 1 is cut in a direction along with a normal line of coating film 3, and a cross section sample is prepared. The cross section sample is observed with SEM. The observation magnification is set to 5000 to 10000 times and the field of view of measurement is set to 100 to 500 μm$^2$. The thickness width is measured at three positions of coating film 3 in one field of view, and the average value of the thickness widths at three positions is calculated. The average value corresponds to the thickness of coating film 3. The thickness of each layer described below is also measured by the same method, unless particularly noted.

The absolute value of the compressive residual stress of coating film 3 may be 6 GPa or less. The compressive residual stress of coating film 3 refers to one internal stress (inherent strain) present in entire coating film 3, which is represented by a minus "–" number (unit: "GPa" used in the present embodiment). Thus, a concept where the compressive residual stress is large indicates that the absolute value of the numerical value is larger, and a concept where the compressive residual stress is small indicates that the absolute value of the numerical value is smaller. In other words, an absolute value of the compressive residual stress, of 6 GPa or less, means that at compressive residual stress of costing film 3 is –6 GPa or more and 0 GPa or less.

When the compressive residual stress of coating film 3 is 0 GPa or less, crack development generated from an outermost surface of coating film 3 is easily suppressed. On the other hand, when the absolute value of the compressive residual stress is 6 GPa or less, the magnification of the stress is appropriate and coating film 3 is easily inhibited from being peeled from an edge portion of cutting tool 1 before the start of cutting.

The compressive residual stress of coating film 3 is measured with an X-ray residual stress apparatus according to a sin$^2$ψ method (see pages 54 to 66 of "X-ray Stress Measurement Method" (The Society of Materials Science, Japan, 1981, published by Yokendo Co., Ltd.)).

The crystal structure of coating film 3 may be cubic. When the crystal structure of coating film 3 is cubic, the hardness of coating film 3 is enhanced. The crystal structure of each layer in coating film 3 may be cubic. The crystal structures of coating film 3 and each layer in costing film 3 can be analyzed with an X-ray diffraction apparatus known in the art.

The hardness of coating film 3 is highly effectively 30 GPa or more and 55 GPa or less, and may be 35 GPa or more and 50 GPa or less. According to this, coating film 3 has sufficient hardness. The hardness of entire coating film 3 is measured by a nano indenter method (Nano Indenter XP manufacture by MTS Systems Corporation). Specifically, the hardness is obtained by measuring the hardness at three points on a surface of coating film 3 as a measurement load of 10 mN (1 gf) by a method according to ISO14577, and calculating the average value of the harnesses at the three points. The average value corresponds to the harness of coating film 3.

<First Layer>

First layer 13 of the present embodiment is composed of an alternate layer where first unit layer 12 and second unit layer 15 are alternately stacked. First layer 13 being composed of an alternate layer where first unit layer 12 and second unit layer 15 are alternately stacked can be confirmed by the difference in contrast in observation of a flake sample including a cross section of coating film 3 with a TEM (transmission electron microscope).

Any of first unit layer 12 and second unit layer 15 may be disposed at a position closest to substrate 2. In FIG. 1, first unit layer 12 is disposed directly on substrate 2, namely, disposed at a position closest to substrata 2. In FIG. 2, second unit layer 15 is disposed directly on substrate 2, namely, disposed at a position closest to substrate 2. Any of first unit layer 12 and second unit layer 15 may be disposed on a surface of coating film 3. In FIG. 1, second unit layer 15 is disposed on a surface of coating film 3. In FIG. 2, first unit layer 12 is disposed on a surface of coating film 3.

The thickness of first layer 13 may be 0.5 μm or more and 15 μm or less. When the thickness of first layer 13 is 0.5 μm or more, excellent wear resistance can be exhibited in continuous machining. When the thickness of first layer 13 is 15 μm or less, excellent chipping resistance can be imparted in intermittent cutting.

The thickness of first layer 13 is measured by observation and measurement of a cross section of coating film 3 with transmission electron microscope (TEM). A specific measurement method is as follows. Cutting tool 1 is cut in a direction along with a normal line of coating film 3, and a flake sample including a cross section of coating film 3 is prepared. The flake sample is observed with TEM. The observation magnification is set to 20000 to 500 times and the field of view of measurement is set to 0.0016 to 80 μm$^2$. The thickness width is measured at three positions of first layer 13 in one field of view, and the average value of the thickness widths at three positions is calculated. The average value corresponds to the thickness of first layer 13.

<Composition of First Unit Layer and Composition of Second Unit Layer>

First unit layer 12 is composed of $Al_aCr_{1-a-b}Ce_bN$, a is more than 0.400 and 0.800 or less, and b is 0.001 or more and 0.100 or less. First unit layer 12 can enhance oxidation resistance and wear resistance of coating film 3. The lower limit of a is highly effectively 0.450 or more, more highly effectively 0.500 or more, further highly effectively 0.550 or more. The upper limit of a is highly effectively 0.770 or less, more highly effectively 0.750 or less, further highly effectively 0.700 or less. a is highly effectively 0.450 or more and 0.770 or less, more highly effectively 0.500 or more and 0.750 or less, further highly effectively 0.550 or more and 0.700 or less. The lower limit of b is highly effectively 0.005 or more, more highly effectively 0.010 or more, further highly effectively 0.015 or more. The upper limit of b is highly effectively 0.070 or less, more highly effectively 0.050 or less, further highly effectively 0.030 or less. b is highly effectively 0.005 or more and 0.070 or less, more highly effectively 0.010 or more and 0.050 or less, further highly effectively 0.015 or ore and 0.030 or less.

In the present disclosure, the "first unit layer being composed of $Al_aCr_{1-a-b}Ce_bN$" means that first unit layer 12 can contain inevitable impurities in addition to $Al_a Cr_{1-a-b}Ce_bN$ as long as the effects of the present disclosure are not impaired. Examples of the inevitable impurities include oxygen and carbon. The content rate of the entire inevitable impurities in first unit layer 12 may be more than 0% by atom and less than 1% by atom. In the present disclosure, the "% by atom" means the proportion (%) of the number of atoms to the total number of atoms constituting the layer.

Second unit layer 15 is composed of $Al_cV_{1-c}N$, and c is 0.40 or more and 0.75 or less. Second unit layer 15 can enhance heat insulation ability, oxidation resistance and toughness of coating film 3. The lower limit of c is highly effectively 0.45 or more, more highly effectively 0.50 or ore, further highly effectively 0.55 or more. c is highly effectively 0.70 or less, highly effectively 0.65 or less, further highly effectively 0.60 or less. The upper limit of c is highly effectively 0.45 or more and 0.70 or less, more highly effectively 0.50 or more and 0.65 or less, further highly effectively 0.55 or more and 0.60 or less.

In the present disclosure, the "second unit layer being composed of $Al_cV_{1-c}N$" means that second unit layer 15 can contain inevitable impurities in addition to $Al_cV_{1-c}N$ as long as the effects of the present disclosure are not impaired. Examples of the inevitable impurities include oxygen and carbon. The content rate of the entire inevitable impurities in second unit layer 15 may be more than 0% by atom and less than 1% by atom.

a, b, c, and the content rate of the evitable impurities in first unit layer 12 and the content rate of the inevitable impurities in second unit layer 15 are measured by elemental analysis of a cross section of coating film 3 with a transmission electron microscope (TEM). A specific measurement method is as follows. Cutting tool 1 is cut in a direction along with a normal line of coating film 3, and a flake sample including a cross section of coating film 3 is prepared. The elemental analysis of first unit layer 12 and second unit layer 15 is performed by measuring the energy and the number of occurrences of characteristic X-ray occurring in irradiation of a flake sample with electron beam by use of EDS (Energy Dispersive X-ray Spectroscopy) attached to TEM. Five layers are arbitrarily selected with respect to each of first unit layer 12 and second unit layer 15, and subjected to elemental analysis. The average composition of such five layers with respect to first unit layer 12 is determined. The average composition corresponds to the composition of first unit layer 12. The average composition of such five layers with respect to second unit layer 15 is determined. The average composition corresponds to the composition of second unit layer 15. It is confirmed that, as long as measurement is mage with the same cutting tool 1, no variation in measurement results is found even if a measurement position is arbitrarily selected.

a and c satisfy a relationship of a>c. Thus, heat insulation ability and oxidation resistance of coating film 3 can be enhanced.

In the present disclosure, the ratio $A_{N1}/A_{M1}$ of the number $A_{N1}$ of atoms of N to the total number $A_{M1}$ of atoms of Al, Cr and Ce in the composition $Al_aCr_{1-a-b}Ce_bN$ of the first unit layer is in the range from 0.8 to 1.2 necessarily in terms of manufacturing. In the present disclosure, the ration $A_{N2}A_{M2}$ of the number $A_{N2}$ of the atoms of N to the total number $A_{M2}$ of atoms of Al and V in the composition $Al_cV_{1-c}N$ of the second unit layer is in the rang from 0.8 to 1.2 necessarily in terms of manufacturing. The ratio $A_{N1}/A_{M1}$ and the ratio $A_{N2}/A_{M2}$ can be measured by a Rutherford back scattering (RBS) method. It is confirmed that, when the ration $A_{N1}/A_{M1}$ and the ration $A_{N2}/A_{M2}$ are in the above ranges, the effects of the present disclosure are not impaired.

<Average Thickness of First Unit Layer and Average Thickness of Second Unit Layer>

The average thickness of first unit layer 12 may be 0.002 µm or more and 0.2 µm or less and the average thickness of second unit layer 15 may be 0.002 µm or more and 0.2 µm or less. According to this, crack development occurring on a surface of coating film 3 can be further suppressed. The lower limit of the average thickness of first unit layer 12 is highly effectively 0.002 µm or more, more highly effectively 0.005 µm or more, further highly effectively 0.01 µm or more. The upper limit of the average thickness of first unit layer 12 is highly effectively 0.20 µm or less, more highly effectively 0.15 µm or less, further highly effectively 0.10 µm or less. The average thickness of first unit layer 12 is more highly effectively 0.005 µm or more and 0.15 µm or less, further highly effectively 0.01 µm or more and 0.1 µm or less. The lower limit of the average thickness of second unit layer 15 is highly effectively 0.002 µm or more, more highly effectively 0.005 µm or more, further highly effectively 0.01 µm or more. The upper limit of the average thickness of second unit layer 15 is highly effectively 0.20 µm or less, more highly effectively 0.15 µm or less, further highly effective 0.10 µm or less. The average thickness of second unit layer 15 is more highly effectively 0.005 µm or more and 0.15 µm or less, further highly effectively 0.01 µm or more and 0.10 µm or less.

The average thickness of first unit layer 12 and the average thickness of second unit layer 15 can be measured by the same method as the measurement method of the thickness of first layer 13.

Figure 5:
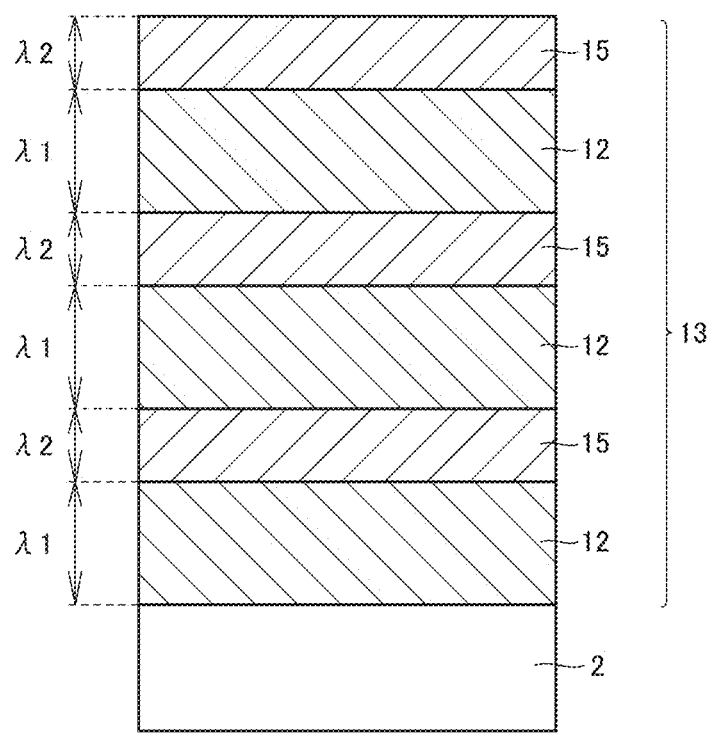
FIG. 5 is a view for describing one example of the thickness ratio of a first unit layer and a second unit layer.
Figure 6:
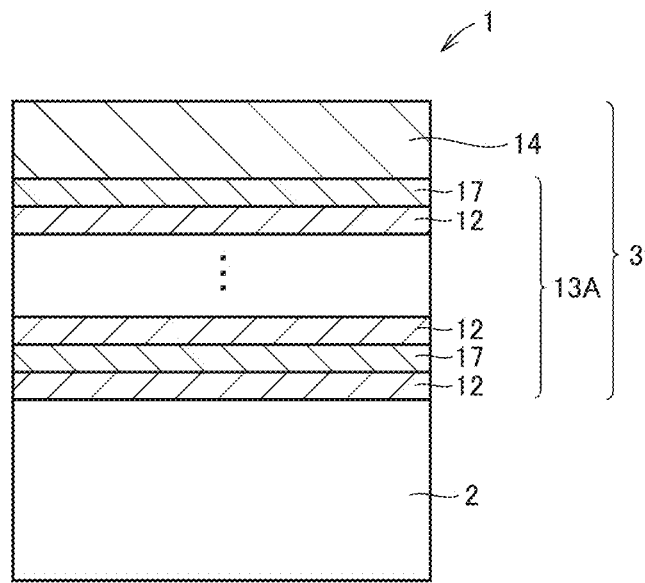
FIG. 6 is a schematic enlarged cross-sectional view of one example of a cutting tool according to Embodiment 2.
Figure 7:
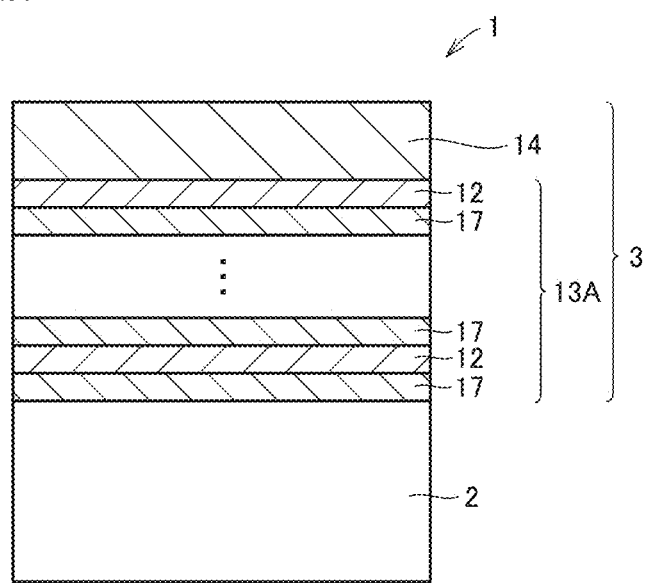
FIG. 7 is a schematic enlarged cross-sectional view of one example of a cutting tool according to Embodiment 2.

As illustrated in FIG. 5, in first unit layer 12 and second unit layer 15 adjacent to first unit layer 12, a ratio $\lambda 1/\lambda 2$ of a thickness $\lambda 1$ of first unit layer 12 to a thickness $\mu 2$ of second unit layer 15 may be 1.0 or more and S.0 or less. First unit layer 12 not only bas high oxidation resistance, but also has the properties of being low in heat conductivity and hardly transferring heat generated in cutting, to substrate 2. When the ratio $\lambda 1/\lambda 2$ is 1.0 or more, the proportion of first unit layer 12 in coating film 3 is relatively increased and the amount of Al in coating film 3 is increased and thus heat insulation ability of entire cutting tool 1 is enhanced. Cutting tool 1 having coating film 3 is enhanced in wear resistance particularly during continuous cutting. When $\lambda 1/\lambda 2$ is 1.0 or more, roughness of coating film 3 tends to be enhanced. On the other hand, when $\lambda 1/\lambda 2$ is 5.0 or less, the effect of suppression of crack development due to stacking of first unit layer 12 and second unit layer 15 tends to be easily obtained. $\lambda 1/\lambda 2$ is highly effectively 1.0 or more, more highly effectively 1.5 or more, further highly effectively 2.0 or more. λ1/λ2 is highly effectively 5.0 or less, more highly effectively 4.0 or less, further highly effectively 3.0 or less. λ1/λ2 is highly effectively 1.0 or more and 5.0 or less, more highly effectively 1.5 or more and 4.0 or less, highly effectively 1.0 or more and 3.0 or less, further highly effectively 2.0 or more and 3.0 or less. While all the thicknesses of three first unit layers 12 are each designated as λ1 and all the thicknesses of three second unit layer 15 are each designated as λ2 for illustration in FIG. 5, the thicknesses λ1 of three first unit layers 12 are not necessarily the same and the thicknesses λ2 of three second unit layers 15 are not necessarily the same as long as the relationship of λ1/λ2 is satisfied between mutually adjacent first unit layer and second unit layer.

The number of layers stacked with respect to each of first unit layer 12 and second unit layer 15 in first layer 13 may be 10 or more and 500 or less. Thus, first unit layer 12 and second unit layer 15 are stacked and therefore the effect of enhancing hardness and compressive residual stress in a well-balanced manner can be sufficiently obtained. The number of layers stacked with respect to each of first unit layer 12 and second unit layer 15 in first layer 13 is more highly effectively 100 or more and 400 or less, further highly effectively 200 or more and 350 or less.

The number of layers stacked with respect to each of first unit layer 12 and second unit layer 15 in first layer 13 can be determined by observation of a flake sample of a cross section of coating film 3 with TEM (transmission electron microscope) at an observation magnification of 20000 to 5000000 with TEM.

<Second Layer>

As illustrated in FIG. 3 and FIG. 4, costing film 3 further includes second layer 16 disposed between substrate 2 and first layer 13, and the composition of second layer 16 may be the same as the composition of first unit layer 12 or the composition of second unit layer 15 (FIG. 3 and FIG. 4). Thus, close adhesion between substrate 2 and coating film 3 can be enhanced.

25 When the composition of second layer 16 is the same as the composition of first unit layer 12, oxidation starting from the interface between substrate 2 and coating film 3 can be suppressed even if substrate 2 is exposed in an early stage of cutting.

When the composition of second layer 16 is the same as the composition of first unit layer 12, the thickness of second layer 16 may be larger than the thickness of first unit layer 12. Thus, close adhesion between substrate 2 and coating film 3 can be more enhanced. In addition, even if substrate 2 is exposed in an early stage of cutting, oxidation starting from the interface between substrate 2 and coating film 3 can be further suppressed. "The thickness of the second layer is larger than the thickness of the first unit layer" can be restated as "the thickness of the second layer is more than 1.0 times the thickness of the first unit layer". The thickness of second layer 16 is highly effectively 2.0 time or more, more highly effectively 4.0 times or more, further highly effectively 10.0 times or more the thickness of first unit layer 12. The thickness of second layer 16 is highly effectively 500 times or less, more highly effectively 120 times or less, further highly effectively 50 times or less the thickness of first unit layer 12. The thickness of second layer 16 is highly effectively 2.0 times or more and 500 times or less, more highly effectively 4.0 times or more and 120 times or less, further highly effectively 10.0 times or more and 50 times or less the thickness of first unit layer 12.

When the composition of second layer 16 is the same as the composition of first unit layer 12, the thickness of second layer 16 may be 0.1 μm or more. If the thickness of second layer 16 is less than 0.1 μm, the effect of suppression of oxidation starting from the interface between substrate 2 and coating film 3 by allowing second layer 16 to be the same in composition as first unit layer 12 tends to be hardly obtained. When the composition of second layer 16 is the same as the composition of first unit layer 12, the thickness of second layer 16 is more highly effectively 0.3 μm or more, further highly effectively 0.4 μm or more. The upper limit value of the thickness of second layer 16 is not particularly limited, and if more than 2 μm, a crystal grain is enlarged to cause the occurrence of a grain boundary, resulting in a tendency to hardly further enhance the above effect of suppression of oxidation. Accordingly, the thickness of second layer 16 can be 2 μm or less in consideration of the cost advantage.

When the composition of second layer 16 is the same as the composition of first unit layer 12, first unit layer 12 may be stacked directly on second layer 16, as illustrated in FIG. 3. As illustrated in FIG. 4, second unit layer 15 may be stacked directly on second layer 16. When the composition of second layer 16 is the same as the composition of first unit layer 12 and first unit layer 12 is stacked directly on second layer 16, second layer 16 and first unit layer 12 have a continuous crystal structure.

When the composition of second layer 16 is the same as the composition of second unit layer 15, second unit layer 15 tends to be small in stress, and thus peeling resistance of coating film 3 can be enhanced particularly in intermittent machining where a load is repeatedly applied to a cutting edge, such as milling or end milling.

When the composition of second layer 16 is the same as the composition of second unit layer 15, the thickness of second layer 16 may be larger than the thickness of second unit layer 15. Thus, peeling resistance of coating film 3 can be further enhanced particularly in intermittent machining where a load is repeatedly applied to a cutting edge, such as milling or end milling. "The thickness of the second layer is larger than the thickness of the second unit layer" can be restated as "the thickness of the second layer is more than 1.0 times the thickness of the second unit layer". The thickness of second layer 16 is highly effectively 2.0 times or more, more highly effectively 4.0 times or more, further highly effectively 10.0 times or more the thickness of second unit layer 15. The thickness of second layer 16 is highly effectively 500 times or less, more highly effectively 120 times or less, further highly effectively 50 times or less the thickness of second unit layer 15. The thickness of second layer 16 is highly effectively 2.0 times or more and 500 times or less, more highly effectively 4.0 times or more and 120 times or less, further highly effectively 10.0 times or more and 50 times or less the thickness of second unit layer 15.

When the composition of second layer 16 is the same as the composition of second unit layer 15, the thickness of second layer 16 is highly effectively 0.1 μm or more. If the thickness of second layer 16 is less than 0.1 μm, the effect of enhancing peeling resistance by allowing second layer 16 to be the same in composition as second unit layer 15 tends to be hardly obtained. When the composition of second layer 16 is the same as the composition of second unit layer 15, the thickness of second layer 16 is more highly effectively 0.3 μm or more, further highly effectively 0.4 μm or more. The upper limit value of the thickness of second layer 16 is not particularly limited, and if more than 2 μm, a more enhancement in peeling resistance described above tends not to be observed. Accordingly, the thickness of second layer 16 is highly effectively 2 μm or less in consideration of the cost advantage.

When the composition of second layer 16 is the same as the composition of second unit layer 15, first unit layer 12 may be stacked directly on second layer 36, as illustrated in FIG. 3. As illustrated in FIG. 4, second unit layer 15 may be stacked directly on second layer 16. When the composition of second layer 16 is the same as the composition of second unit layer 15 and second unit layer 15 is stacked directly on second layer 16, second layer 16 and second unit layer 15 have a continuous crystal structure.

<Third Layer>

As illustrated in FIG. 1 to FIG. 4, coating film 3 further includes third layer 14 provided on first layer 13 opposite to substrate 2, and third layer 14 may be composed of AlCrCeCN. Thus, the coefficient of friction of coating film 3 can be reduced to result in an increase in life of cutting tool 1.

In general, carbonitride tends to be lower in coefficient of friction to a workpiece, than nitride. Such a reduction in coefficient of friction is considered to be due to contribution of a carbon atom. When coating film 3 includes third layer 14, the coefficient of friction of coating film 3 to a workpiece is reduced to result in an increase in life of cutting tool 1.

The compositional ratio of N and C in third layer 14 can be adjusted to thereby allow a predetermined color to be imparted. Thus, designability and discrimination can be imparted to the appearance of cutting tool 1, and the tool is commercially useful.

The ratio N2/N1 of the number N2 of atoms of aluminum to the total number N1 of atoms of aluminum, chromium and cerium in third layer 14 may be more than 0.4 and 0.8 or less. Thus, the tool life of cutting tool 1 is further increased.

The thickness of third layer 14 is highly effectively 0.1 μm or more. When the thickness of third layer 14 is 0.1 μm or more, the effect of imparting lubricability by third layer 14 is easily obtained. In this regard, the upper limit value of the thickness of third layer 14 is not particularly limited, and if more than 2 μm, the above effect of imparting lubricability tends not to be able to be further enhanced. Accordingly, the thickness of third layer 14 may be 2 μm or less in consideration of the cost advantage.

<Intermediate Layer>

Coating film 3 can include an intermediate layer disposed between second layer 16 and first layer 13, or between first layer 13 and third layer 14. Examples of the intermediate layer include TiAlCeN, AlCrN, AlCrBN, and AlCrSiN. The thickness of the intermediate layer can be 0.1 μm or more and 2 μm or less, 0.3 μm or more and 1.5 μm or less, or 0.4 μm or more and 1.0 μm or less.

Embodiment 2: Cutting Tool (2)

A cutting tool according to another embodiment of the present disclosure is described with reference to FIG. 6 to FIG. 10.

Cutting tool 1 according to another embodiment of the present disclosure (hereinafter, also designated as "Embodiment 2") is cutting cool 1 comprising substrate 2 and coating film 3 disposed on substrate 2, wherein coating film 3 includes a first A layer 13A, first A layer 13A is composed of an alternate layer where first unit layer 12 and a third unit layer 17 are alternately stacked, first omit layer 12 is composed of $Al_aCr_{1-a-b}Ce_bN$, a is more than 0.400 and 0.800 or less, b is 0.001 or more and 0.100 or less, third unit layer 17 is composed of $Al_dV_{1-d-e}M_eN$, M is silicon or boron, d is 0.40 or more and 0.75 or less, e is more than 0 and 0.05 or less, and a and d satisfy a relationship of a>d.

Cutting tool 1 of Embodiment 1 can have a long tool life particularly even in cutting machining to be carried out under a high cutting edge temperature. The reason for this is presumed as follows.

(a2) First unit layer 12 is composed of a nitride containing Al, Cr and Ce. Al s easily oxidized and therefore a dense oxide layer composed of $Al_2O_3$ is easily formed on a surface of coating film 3 of first unit layer 12. Furthermore, Ce is low in standard energy of formation of oxide as compared with Al, and thus more easily oxidized and more easily forms a dense oxide layer composed of $CeO_2$ on a surface of coating film 3 of first unit layer 12 than Al. Such an oxide layer can enhance oxidation resistance of coating film 3, can decrease reactivity with a workpiece and can reduce the coefficient of friction with a workpiece. Accordingly, cutting tool 1 comprising coating film 3 can achieve a long life under severe machining conditions where the cutting edge temperature is easily increased, including dry machining, and machining of a hard-to-cut material.

(b2) The lattice constant of CeN is 5.01 Å, and is larger than 4.15 Å being the lattice constant CrN and 4.12 Å being the lattice constant of AlN. Therefore, strain is introduced to first unit layer 12 composed of cubic $Al_aCr_{1-a-b}Ce_bN$ formed with addition of Ce, and first unit layer 12 is enhanced in hardness and wear resistance and cutting tool 1 comprising first unit layer 12 is increased in life.

(c2) Third unit layer 15 is composed of a nitride containing Al, V, M (M is silicon or boron). A layer including Al, V, M and N is excellent in balance among heat insulation resistance, oxidation resistance and toughness. Accordingly, the third unit layer can contribute to an increase in life of a surface-covered cutting tool.

(d2) When a layer composed of a nitride containing Al, Cr and Ce (hereinafter, also designated "AlCrCeN layer".) and a layer composed of a nitride containing Al, V and M (M is silicon or boron) (hereinafter, also designated as "AlVMN layer".) are compared, the AlCrCeN layer hardly leads to spinodal decomposition at high temperature. If spinodal decomposition occurs, soft hexagonal AlN is precipitated to cause deterioration in hardness. The AlCrCeN layer has the properties of being suppressed in deterioration in hardness at high temperature, being large in compressive residual stress, and being excellent in chipping resistance. The AlVMN layer has the properties of being small in compressive residual stress and being high in heat insulation ability. The AlVMN layer is oxidized in cutting to produce $V_2O_3$ as an oxide of V. The melting point of $V_2O_3$ is 690° C. and thus $V_2O_3$ is softened and functions as a lubricant at a temperature during cutting machining, and a reduction of coefficient of friction on a rake face of the tool can be achieved. First A layer 13A is composed of an alternate layer where first unit layer 12 composed of the AlCrCeN layer and third unit layer 17 composed of the AlVMN layer are alternately stacked, and thus can have the properties of high hardness due to first unit layer 12 and high heat insulation ability due to third unit layer 17. The property of small compressive residual stress due to third unit layer 17 is complemented with large compressive residual stress due to first layer 12. Accordingly, first A layer 13A is entirely enhanced in hardness, heat insulation ability and compressive residual stress in a well-balanced manner, and the life of cutting tool 1 comprising first A layer 13A is increased.

(e2) First A layer 13A is composed of an alternate layer where first unit layer 12 and third unit layer 17 are alternately stacked. The composition and the crystal lattice are discontinuous at the interface between first unit layer 12 and third unit layer 17. Therefore, when cracks occur from a surface of coating film 3 in cutting, crack development can be suppressed at the interface. Accordingly, chipping and breakage are suppressed and the life of cutting tool 1 is increased.

(f2) First unit layer 12 is composed of $Al_aCr_{1-a-b}Ce_bN$, thin unit layer 17 is composed of $Al_dV_{1-d-e}M_eN$, and a and d satisfy a relationship of a>d. First unit layer 12 tends to be easily high in content of Al as compared with third unit layer 17. The content of Al in first unit layer 12 can be high to result in an increase in content of Al contained in entire first A layer 13A. As a result, heat insulation ability and oxidation resistance of first A layer 13A can be enhanced and the life of cutting tool 1 comprising first A layer 13A is increased.

Cutting tool 1 of Embodiment 2 can have basically the same configuration as in cutting tool 1 of Embodiment 1, except for the configurations of first A layer 13A and second layer 16. Hereinafter, the "first A layer" and the "second layer" will be described.

<First A Layer>

First A layer 13A of the present embodiment is composed of an alternate layer where first unit layer 12 and third unit layer 17 are alternately stacked. First A layer 13A being composed of an alternate layer where first unit layer 12 and third unit layer 17 are alternately stacked can be confirmed by the difference in contrast in observation of a cross section of coating film 3 with a TEM (transmission electron microscope). The thickness of first A layer 13A can be the same configuration as the thickness of first layer 13 described in Embodiment 1.

<Composition of First Unit Layer and Composition of Third Unit Layer>

The composition $Al_aCr_{1-a-b}Ce_bN$ of first unit layer 12 in Embodiment 2 can be the same as the composition $Al_aCr_{1-a-b}Ce_bN$ of first unit layer 12 in Embodiment 1.

Third unit layer 17 is composed of $Al_dV_{1-d-e}M_eN$, M is silicon or boron, d is 0.40 or more and 0.75 or less, and e is more than 0 and 0.05 or less. Third unit layer 17 can have both excellent hardness and excellent oxidation resistance. The reason for this is presumed as follows.

When M is boron, the hardness of third unit layer 17 is increased by boron and the hardness of entire coating film 3 is increased. Boron oxide formed by oxidation of a surface of cutting tool 1 according to cutting densifies an oxide of Al in third unit layer 17, resulting in an enhancement in oxidation resistance of third unit layer 17. Furthermore, boron oxide has a low melting point, and thus serves as a lubricant during cutting and can suppress adhesion of a workpiece.

When M is silicon, the texture of third unit layer 17 is refined to lead to enhancements in hardness and oxidation resistance of third unit layer 17, resulting in enhancements in hardness and oxidation resistance of entire coating film 3.

d is 0.40 or more and 0.75 or less. Thus, the crystal structure of third unit layer 17 is cubic to thereby lead to an increase in hardness of third unit layer 17, resulting in an enhancement in wear resistance of third unit layer 17. The lower limit of d is highly effectively 0.45 or more, more highly effectively 0.50 or more, further highly effectively 0.55 or more. The upper limit of d is highly effectively 0.75 or less, more highly effectively 0.70 or less, further highly effectively 0.65 or less. d is highly effectively 0.45 or more and 0.75 or less, more highly effectively 0.50 or more and 0.70 or less, further highly effectively 0.55 or more and 0.65 or less.

e is more than 0 and 0.05 or less. Thus, the hardness of first layer 13 and oxidation resistance of first layer 13 can be enhanced. The lower limit of e is highly effectively 0.002 or more, more highly effectively 0.005 or more, further highly effectively 0.01 or more. e is highly effectively 0.04 or less, more highly effectively 0.03 or less, further highly effectively 0.02 or less. e is highly effectively 0.002 or more and 0.05 or less, more highly effectively 0.005 or more and 0.03 or less, further highly effective 0.01 or more and 0.02 or less.

In the present disclosure, the "third unit layer being composed of $Al_dV_{1-d-e}M_eN$" means that third unit layer 17 can contain inevitable impurities in addition to $Al_dV_{1-d-e}M_eN$ as long as the effects of the present disclosure are not impaired. Examples of the inevitable impurities include oxygen and carbon. The content of the entire inevitable impurities in third unit layer 17 may be more than 0% by atom and less than 1% by atom.

d, e, and the content rate of the inevitable impurities in third unit layer 17 can be determined by the same method as the measurement method of a. It is here confirmed that, as long as measurement is made with the same cutting tool 1, no variation in measurement results is found even if a measurement position is arbitrarily selected.

a and d satisfy a relationship of a>d. Thus, heat insulation ability and oxidation resistance of coating film 3 can be enhanced.

In the present disclosure, the ratio $A_{N1}/A_{M1}$ of the number $A_{N1}$ of atoms of N to the total number $A_{M1}$ of atoms of Al, Cr and Ce in the composition $Al_aCr_{1-a-b}Ce_bN$ of the first unit layer is in the range from 0.8 to 1.2 necessarily in terms of manufacturing. In the present disclosure, the ratio $A_{N3}/A_{M3}$ of the number $A_{N3}$ of atoms of N to the total number $A_{M3}$ of atoms of Al, V and M in the composition $Al_dV_{1-d-e}M_eN$ of the third unit layer is in the range from 0.8 to 1.2 necessarily in terms of manufacturing. The ratio $A_{N1}/A_{M1}$ and the ratio $A_{N3}/A_{M3}$ can be measured by a Rutherford back scattering (RBS) method. It is confirmed that, when the ratio $A_{N1}/A_{M1}$ and the ratio $A_{N3}/A_{M3}$ are in the above ranges, the effects of the present disclosure are not impaired.

<Average Thickness of Third Unit Layer and Average Thickness of First Unit Layer and Third Unit Layer>

The average thickness of first unit layer 12 may be 0.002 μm or more and 0.2 μm or less and the average thickness of third unit layer 17 may be 0.002 μm or more and 0.2 μm or less. Accord to this, crack development occurring on a surface of coating film 3 can be further suppressed. The lower limit of the average thickness of first unit layer 12 is highly effectively 0.002 μm or more, more highly effectively 0.005 μm or more, further highly effectively 0.01 μm or more. The upper limit of the average thickness of first unit layer 12 is highly effectively 0.20 μm or less, more highly effectively 0.15 μm or less, further highly effectively 0.10 μm or less. The average thickness of first unit layer 12 is more highly effectively 0.005 μm or more and 0.15 μm or less, further highly effectively 0.01 μm or more and 0.1 μm or less. The lower limit of the average thickness of third unit layer 17 is highly effectively 0.002 μm or more, more highly effectively 0.005 μm or more, further highly effectively 0.01 μm or more. The upper limit of the average thickness of third unit layer 17 is highly effectively 0.20 μm or less, more highly effectively 0.15 μm or less, further highly effectively 0.10 μm or less. The average thickness of third unit layer 17 is more highly effectively 0.005 μm or more and 0.15 μm or less, further highly effectively 0.01 μm or more and 0.10 μm or less.

The average thickness of first unit layer 12 and the average thickness of third unit layer 17 can be measured by the same method as the measurement method of the thickness of first layer 13.

Figure 10:
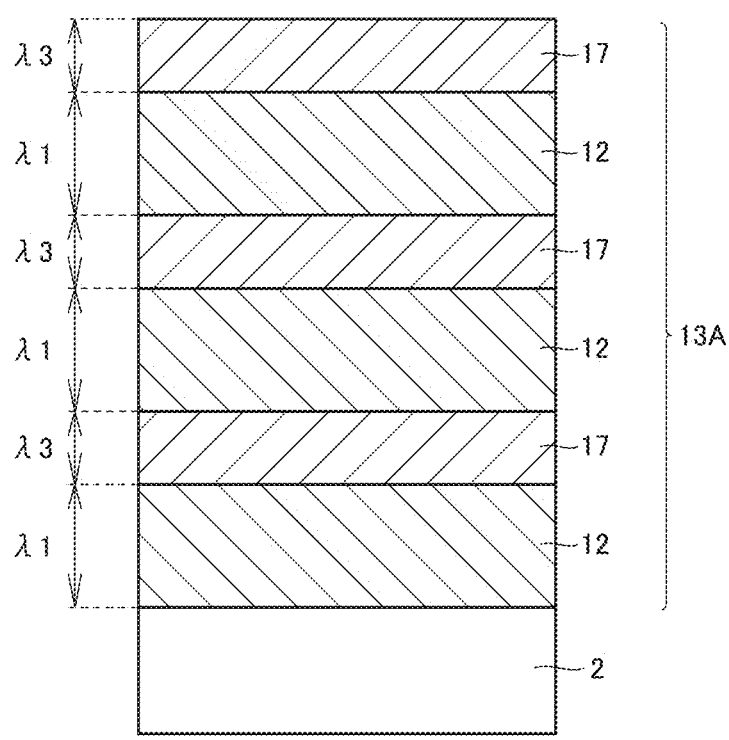
FIG. 10 is a view for describing one example of the thickness ratio of a first unit layer and a third unit layer.

As illustrated in FIG. 10, in first unit layer 12 and third unit layer 17 adjacent to first unit layer 12, a ratio $\lambda1/\lambda3$ of a thickness $\lambda1$ of first unit layer 12 to a thickness $\lambda3$ of third unit layer 17 may be 1.0 or more and 5.0 or less. First unit layer 12 not only has high oxidation resistance, but also has the properties of being low in heat conductivity and hardly transferring heat generated in cutting, to substrate 2. When the ratio $\lambda1/\lambda3$ is 1.0 or more, the proportion of first unit layer 12 in coating film 3 is relatively increased and the amount of Al in coating film 3 is increased and thus heat insulation ability of entire cutting tool 1 is enhanced. Cutting tool 1 having coating film 3 is enhanced in wear resistance particularly during continuous cutting. When $\lambda1/\lambda3$ is 1.0 or more, toughness of coating film 3 tends to be enhanced. On the other hand, when $\lambda1/\lambda3$ is 5.0 or less, the effect of suppression of crack development due to stacking of first unit layer 12 and third unit layer 17 tends to be easily obtained. $\lambda1/\lambda3$ is highly effectively 1.0 or more, more highly effectively 1.5 or more, further highly effectively 2.0 or more. $\lambda1/\lambda3$ is highly effectively 5.0 or less, more highly effectively 4.0 or less, further highly effectively 3.0 or less. $\lambda1/\lambda3$ is highly effectively 1.0 or more and 5.0 or less, more highly effectively 1.5 or more and 4.0 or less, highly effectively 1.0 or more and 3.0 or less, further highly effectively 2.0 or more and 3.0 or less. While all the thicknesses of three first unit layer 12 are each designated as $\lambda1$ and all the thicknesses of three third layers 17 are each designated as $\lambda3$ for illustration in FIG. 10, the thicknesses $\lambda1$ of three first unit layers 12 are not necessarily the same and the thicknesses $\lambda3$ of three third unit layer 17 are not necessarily the same as long as the relationship of $\lambda1/\lambda2$ is satisfied between mutually adjacent first unit layer and third unit layer.

The number of layers stacked with respect to each of first unit layer 12 and third unit layer 17 in first A layer 13A may be 10 or more and 500 or less. Thus, first unit layer 12 and third unit layer 17 are stacked and therefore the effect of enhancing hardness and compressive residual stress in a well-balanced manner tends to be easily obtained. The number of layers stacked with respect to each of first unit layer 12 and third unit layer 17 in first A layer 13A is more highly effectively 100 or more and 400 or less, further highly effectively 200 or more and 350 or less.

The number of layers stacked with respect to each of first unit layer 12 and third unit layer 17 in first A layer 13A can be determined by the same method as the measurement method of the number of layers stacked with respect to each of first unit layer 12 and second unit layer 15 described in Embodiment 1.

<Second Layer>

Figure 8:
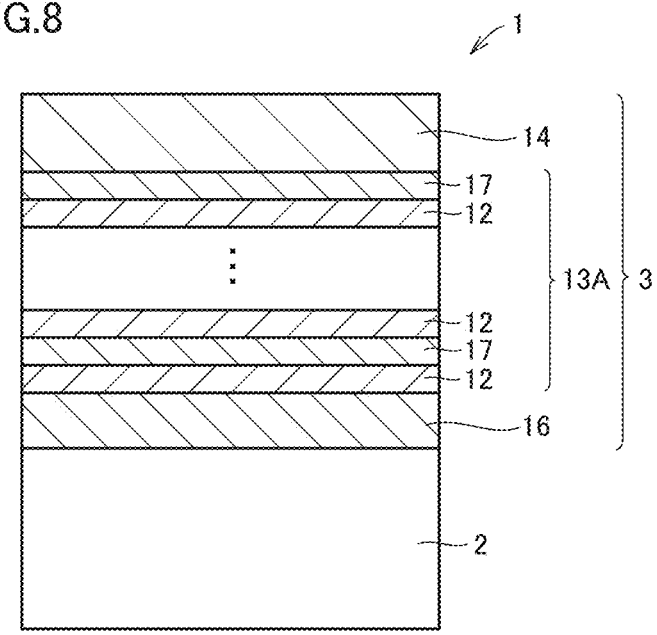
FIG. 8 is a schematic enlarged cross-sectional view of one example of a cutting tool according to Embodiment 2.
Figure 9:
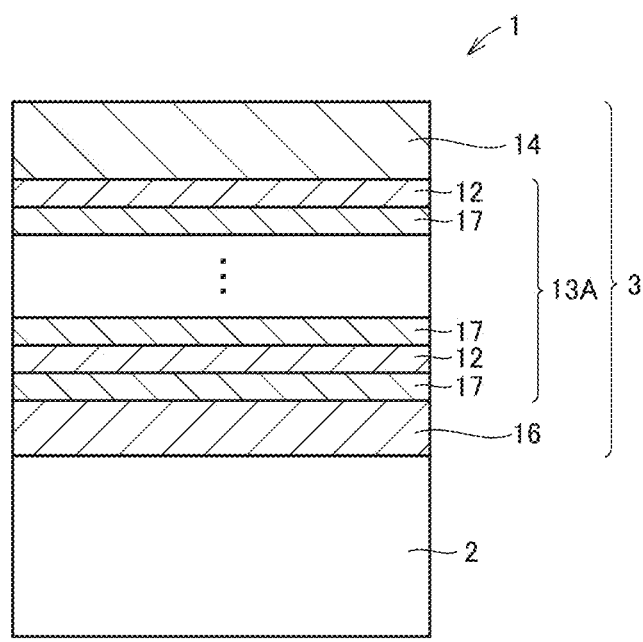
FIG. 9 is a schematic enlarged cross-sectional view of one example of a cutting tool according to Embodiment 2.

As illustrated in FIG. 8 and FIG. 9, coating film 3 further includes second layer 16 disposed between substrate 2 and first A layer 13A, and the composition of second layer 16 may be the same as the composition of first unit layer 12 or the composition of third unit layer 17 (FIG. 3 and FIG. 4). Thus, close adhesion between substrate 2 and coating film 3 can be enhanced.

When the composition of second layer 16 is the same as the composition of first unit layer 12, oxidation starting from the interface between substrate 2 and coating film 3 can be suppressed even if substrate 2 is exposed in an early state of cutting.

When the composition of second layer 16 is the same as the composition of first unit layer 12, the thickness of second layer 16 may be larger than the thickness of first unit layer 12. Thus, close adhesion between substrate 2 and coating film 3 can be more enhanced. In addition, even if substrate 2 is exposed in an early stage of cutting, oxidation starting from the interface between substrate 2 and coating film 3 can be further suppressed. "The thickness of the second layer is larger than the thickness of the first unit layer" can be restated as "the thickness of the second layer is more than 1.0 times the thickness of the first unit layer". The thickness of second layer 16 is highly effectively 2.0 times or more, more highly effectively 4.0 times or more, further highly effectively 10.0 times or more the thickness of first unit layer 12. The thickness of second layer 16 is highly effectively 500 times or less, more highly effectively 120 times or less, further highly effectively 50 times or less the thickness of first unit layer 12. The thickness of second layer 16 is highly effectively 2.0 times or more and 500 times or less, more highly effectively 4.0 times or more and 120 times or less, further highly effectively 10.0 times or more and 50 times or less the thickness of first unit layer 12.

When the composition of second layer 16 is the same as the composition of first unit layer 12, the thickness of second layer 16 may be 0.1 μm or more. If the thickness of second layer 16 is less than 0.1 μm, the effect of suppression of oxidation starting from the interface between substrate 2 and costing film 3 by allowing second layer 16 to be the same in composition as first unit layer 12 tends to be hardly obtained. When the composition of second layer 16 is the same as the composition of first unit layer 12, the thickness of second layer 16 is more highly effectively 0.3 μm or more, further highly effectively 0.4 μm or more. The upper limit of the thickness of second layer 16 is not particularly limited, and if more than 2 μm, a crystal grain is enlarged to cause the occurrence of a grain boundary, resulting in a tendency to hardly further enhance the above effect of suppression of oxidation. Accordingly, the thickness of second layer 16 is highly effectively 2 μm or less in consideration of the cost advantage.

When the composition of second layer 16 is the same as the composition of first unit layer 12, first unit layer 12 may be stacked directly on second layer 16, as illustrated in FIG. 8. As illustrated in FIG. 9, second unit layer 15 may be stacked directly on second layer 16. When the composition of second layer 16 is the same as the composition of first unit layer 12 and first unit layer 12 is stacked directly on second layer 16, second layer 16 and first unit layer 12 have a continuous crystal structure.

When the composition of second layer 16 is the same as the composition of third unit layer 17, third unit layer 17 tends to be small in stress, and thus peeling resistance of coating film 3 can be enhanced particularly in intermittent machining where a load is repeatedly applied to a cutting edge, such as milling or end milling.

When the composition of second layer 16 is the same as the composition of third unit layer 17, the thickness of second layer 16 may be larger than the thickness of third unit layer 17. Thus, peeling resistance of coating film 3 can be further enhanced particularly in intermittent machining where a load is repeatedly applied to a cutting edge, such as milling or end milling. "The thickness of the second layer is larger than the thickness of the third unit layer" can be restated as "the thickness of the second layer is more than 1.0 times the thickness of the third unit layer". The thickness of second layer 16 is highly effectively 2.0 times or more, more highly effectively 4.0 time or more, further highly effectively 10.0 times or more the thickness of third unit layer 17. The thickness of second layer 16 is highly effectively 500 times or less, more highly effectively 120 times or less, further highly effectively 50 times or less the thickness of third unit layer 17. The thickness of second layer 16 is highly effectively 2.0 times or more and 500 times or less, more highly effectively 4.0 times or more and 120 times or less, further highly effectively 10.0 times or more and 50 times or less the thickness of third unit layer 17.

When the composition of second layer 16 is the same as the composition of third unit layer 17, the thickness of second layer 16 is highly effectively 0.1 µm or more. If the thickness of second layer 16 is less than 0.1 µm, the effect of enhancing peeling resistance by allowing second layer 16 to be the same in composition as third unit layer 17 tends to be hardly obtained. When the composition of second layer 16 is the same as the composition of third unit layer 17, the thickness of second layer 16 is more highly effectively 0.3 µm or more, further highly effectively 0.4 µm or more. The upper limit value of the thickness of second layer 16 is not particularly limited, and of more than 2 µm, a more enhancement in peeling resistance described above tends not to be observed. Accordingly, the thickness of second layer 16 is highly effectively 2

When the composition of second layer 16 is the same as the composition of third unit layer 17, first unit layer 12 may be stacked directly on second layer 16, as illustrated in FIG. 8. As illustrated in FIG. 9, third unit layer 17 may be stacked directly on second layer 16. When the composition of second layer 16 is the same as the composition of third unit layer 17 and third unit layer 17 is stacked directly on second layer 16, second layer 16 and third unit layer 17 have a continuous crystal structure.

Embodiment 3: Method for Producing Cutting Tool

In Embodiment 3, a method for manufacturing cutting tool 1 of Embodiment 1 or Embodiment 2 is described. The manufacturing method comprises a first step of preparing substrate 2, and a second step of forming coating film 3 on substrate 2. The second step includes a step of forming first layer 13 or first A layer 13A. The detail of each step is described below.

<First Step>

In the first step, substrate 2 is prepared. Substrate 2 here used can be substrate 2 described in Embodiment 1.

When cemented carbide is used as a substrate 2, the substrate may be a commercially available substrate or may be manufactured by a common powder metallurgy method. In the case of manufacturing by a common powder metallurgy method, a WC powder and a Co powder or the like are mixed by a ball mill or the like to obtain a mixed powder. The mixed powder is dried, and thereafter molded into a predetermined shape and thus a molded article is obtained. Furthermore, the molded article is sintered to thereby obtain WC-Co-type cemented carbide (sintered material). Next, the sintered material is subjected to predetermined cutting edge machining such as boning treatment, and thus a substrate composed of the WC-Co-type cemented carbide can be manufactured. Any substrate, even if is a substrate other than the above, can be prepared as long as it is a substrate conventionally known as the above type of the substrate.

<Second Step>

In the second step, coating film 3 is formed on substrate 2. The second step includes a step of forming first layer 13 or first A layer 13A.

In the "forming a first layer", first unit layer 12 and second unit layer 15 are alternately stacked by use of a physical vapor deposition (PVD) method to thereby form first layer 13. In the "forming a first A layer", first unit layer 12 and third unit layer 17 are alternately stacked by use of a PVD method to thereby form first A layer 13A. It is highly effective for an enhancement in wear resistance of coating film 3 including first layer 13 or first A layer 13A to form a layer composed of a compound high in crystallinity. The present inventors have made studies about various methods, as the method for forming first layer 13 and first A layer 13A, and as a result, have found that use of a physical vapor deposition method is highly effective.

The PVD method here used can be at least one selected from the group consisting of a cathode arc ion plating method, a balanced magnetron sputtering method, an unbalanced magnetron sputtering method, and a HiPIMS method. In particular, a cathode arc ion plating method may be used where a raw element is high in ionization rate. In the case of use of the cathode arc ion plating method, ion bombardment treatment of metal can be applied to a surface of substrate 2 before formation of first layer 13 or first A layer 13A, and thus close adhesion between substrate 2 and coating film 3 including first layer 13 or first A layer 13A is remarkably enhanced.

The cathode arc ion plating method can be performed by, for example, placing not only substrate 2, but also a cathode as a target, in an apparatus, and thereafter applying a high voltage to the target to generate arc discharge, thereby ionizing and vaporizing any atom constituting the target, and depositing a substance on substrate 2.

The balanced magnetron sputtering method can be performed by, for example, not only placing substrate 2 in an apparatus, but also placing a target on a magnetron electrode provided with a magnet for formation of an equilibrated magnetic field, applying a high-frequency power between the magnetron electrode and substrata 2 to thereby generate gas plasma, and allowing an ion of gas produced by generation of the gas plasma to collide with the target and depositing an atom emitted from the target, on substrate 2.

The unbalanced magnetron sputtering method can be performed by, for example, non-equilibrating the magnetic field generated by the magnetron electrode in the balanced magnetron sputtering method. Furthermore, a high voltage can also be applied, and a HiPIMS method that provides a dense film can also be used.

<Other Step>

The second step can include, in addition to the step of forming first layer 13 or first A layer 13A, surface treatment step such as surface polishing or shot blast. The second step can also include a step of forming other layer(s) such as second layer 16, third layer 14 and the intermediate layer. Such other layer(s) can be formed by a conventionally known chemical vapor deposition method or physical vapor deposition method. Such other layer(s) are/is highly effectively formed by a physical vapor deposition method from the viewpoint that such other layer(s) can be continuously formed together with first unit layer 12, and second unit layer 15 or third unit layer 17 in one physical vapor deposition apparatus.

EXAMPLES

The present embodiment will be further specifically described with reference to Examples. Herein, the present embodiment is not limited by these Examples.

Example 1

Sample 1-1 to Sample 1-16, Sample 1-101 to Sample 1-109

<<Production of Cutting Tools>>

Figure 11:
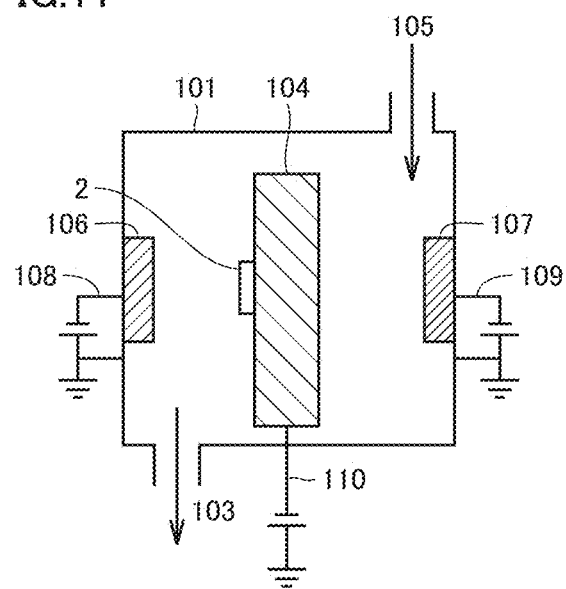
FIG. 11 is a schematic cross-sectional view of a cathode arc ion plating apparatus used in Example.
Figure 12:
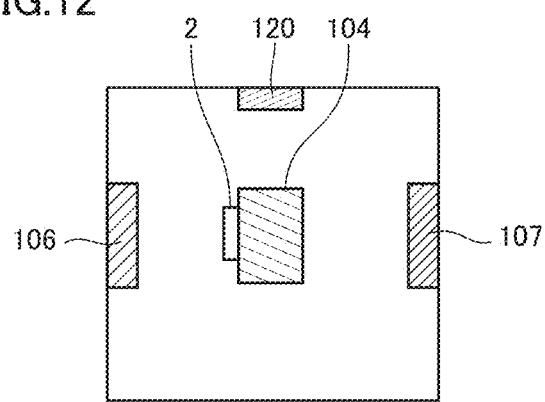
FIG. 12 is a schematic top view of the cathode arc ion plating apparatus illustrated in FIG. 11.

FIG. 11 is a schematic cross-sectional view of a cathode arc ion plating apparatus used in the present Example, and FIG. 12 is a schematic top view of the apparatus of FIG. 11. In each apparatus of FIG. 11 and FIG. 12, a cathode 106 for a first unit layer, a cathode 107 for a second unit layer and a cathode 120 for a third layer, each being an alloy target serving as a metallic raw material of coating film 3, and a rotary substrate holder 104 for placing a substrate are mounted in a chamber 101. A cathode (not illustrated) for a second layer is also mounted in chamber 101 in the apparatus used in Sample 1-13 to Sample 1-14. The composition of the cathode for a second layer was adjusted so that the composition of the second layer as shown in Table 1 and Table 2 was obtained. An arc power supply 108 is mounted to cathode 106, and an arc power supply 109 is mounted to cathode 107. A bias power supply 110 is mounted to substrate holder 104. A gas inlet through which a gas 105 is introduced is provided and also a gas exhaust 103 for regulation of the pressure in chamber 101 is provided in chamber 101, and a structure is taken where the gas in chamber 101 can be suctioned from gas exhaust 103 by a vacuum pump.

A chip at the cemented carbide grade of JIS standard P30, having the shape of CNMG120408 of JIS standard, and a chip of SEMT13T3AGSN, manufactured by Sumitomo Electric Industries, Ltd., were each loaded as a substrate onto substrate holder 104.

Next, the pressure in chamber 101 was reduced by a vacuum pump and also the temperature was raised to 500° C. by a heater placed in the apparatus under rotation of the substrate, and chamber 101 was evacuated until the pressure therein reached $1.0 \times 10^{-4}$ Pa. Next, an argon gas was introduced from the gas inlet to retain the pressure in chamber 101 at 2.0 Pa, the voltage of bias power supply 110 was gradually increased to −1000 V, and a surface of the substrate was cleaned for 15 minutes. Thereafter, an argon gas was exhausted from chamber 101 to thereby clean the substrate (argon bombardment treatment). As described above, the substrate of the cutting tool of each Sample was prepared.

Next, while nitrogen as a reaction gas was introduced in the state of rotation of the substrate at the center and also the temperature of the substrate, the pressure of a reaction gas and the voltage of bias power supply 110 were respectively kept at 500°C., at 2.0 Pa and at a certain value in the range from −50 V to −200 V, an arc current of 120 A was supplied to each of cathodes 106 and 107, thereby generating metal ions from cathodes 106 and 107, to form a second layer and a first layer each having a composition shown in Table 1 and Table 2, on the substrate. Herein, the composition of cathode 106 was adjusted so that the composition of the first unit layer as shown in Table 1 and Table 2 was obtained. The composition of cathode 107 was adjusted so that the composition of the second unit layer as shown in Table 1 and Table 2 was obtained.

In the case of formation of the second layer, the first layer was formed by alternately stacking a first unit layer and a second unit layer one by one on the second layer for the respective numbers of layers stacked as shown in Table 1 and Table 2. In the case of formation of no second layer, the first layer was formed by alternately stacking a first unit layer and a second unit layer one by one on the substrate for the respective numbers of layers stacked as shown in Table 1 and Table 2. The thickness of the second layer, and the thickness and the number of layers stacked with respect to each of the first unit layer and the second unit layer in the first layer were adjusted by the rotational rate of the substrate. When the respective thickness of the second layer and the first layer reached the thicknesses as shown in Table 1 and Table 2, the current supplied to a vaporization source was stopped.

Next, while nitrogen and a methane gas as reaction gases were introduced into chamber 101 and also the temperature of the substrate, the pressure of the reaction gases and the voltage of bias power supply 110 were respectively kept at 400° C., at 2.0 Pa and at −300 V, an arc current of 100 A was suppled to cathode 120, thereby generating a metal ion from cathode 120, to form a third layer on the first layer. When the thickness of the third layer reached the thickness as shown in Table 1 and Table 2, the current supplied to a vaporization source was stopped. Herein, the composition of cathode 120 was adjusted so that the composition of the third layer as shown in Table 1 and Table 2 was obtained. The amount of nitrogen introduced and the amount of a methane gas introduced were adjusted so that the composition of the third layer as shown in Table 1 and Table 2 was obtained. As described above, the cutting tool of each Sample was produced.

TABLE 1

| | First layer | | | | | | | | |
|---|---|---|---|---|---|---|---|---|---|
| | First unit layer $Al_aCr_{1-a-b}Ce_bN$ | | | Second unit layer $Al_cV_{1-c}N$ | | | | | |
| Sample No. | a | b | Average thickness [μm] | c | Average thickness [μm] | a − c | λ1/λ2 | Number of layers stacked | Thickness [μm] |
| 1-1 | 0.450 | 0.010 | 0.001 | 0.40 | 0.001 | 0.050 | 1.00 | 1800 | 3.6 |
| 1-2 | 0.800 | 0.010 | 0.200 | 0.70 | 0.020 | 0.100 | 10.00 | 15 | 3.3 |
| 1-3 | 0.650 | 0.001 | 0.250 | 0.63 | 0.100 | 0.020 | 2.50 | 10 | 3.5 |
| 1-4 | 0.650 | 0.100 | 0.150 | 0.61 | 0.250 | 0.040 | 0.60 | 8 | 3.2 |
| 1-5 | 0.600 | 0.020 | 0.004 | 0.40 | 0.004 | 0.200 | 1.00 | 300 | 2.4 |
| 1-6 | 0.780 | 0.020 | 0.007 | 0.75 | 0.007 | 0.030 | 1.00 | 300 | 4.2 |
| 1-7 | 0.700 | 0.050 | 0.009 | 0.65 | 0.009 | 0.050 | 1.00 | 300 | 5.4 |
| 1-8 | 0.690 | 0.030 | 0.100 | 0.65 | 0.020 | 0.040 | 5.00 | 30 | 3.6 |

TABLE 1-continued

| | | | | | | | | | |
|---|---|---|---|---|---|---|---|---|---|
| 1-9  | 0.680 | 0.040 | 0.002 | 0.63 | 0.100 | 0.050 | 0.02 | 30  | 3.1  |
| 1-10 | 0.700 | 0.020 | 0.200 | 0.69 | 0.100 | 0.010 | 2.00 | 40  | 12.0 |
| 1-11 | 0.650 | 0.020 | 0.003 | 0.60 | 0.002 | 0.050 | 1.50 | 600 | 3.0  |
| 1-12 | 0.610 | 0.010 | 0.002 | 0.57 | 0.200 | 0.040 | 0.01 | 20  | 4.0  |
| 1-13 | 0.650 | 0.020 | 0.010 | 0.60 | 0.010 | 0.050 | 1.00 | 200 | 4.0  |
| 1-14 | 0.730 | 0.020 | 0.005 | 0.61 | 0.020 | 0.120 | 0.25 | 300 | 7.5  |
| 1-15 | 0.750 | 0.020 | 0.005 | 0.70 | 0.005 | 0.050 | 1.00 | 300 | 3.0  |
| 1-16 | 0.680 | 0.020 | 0.010 | 0.45 | 0.010 | 0.230 | 1.00 | 200 | 4.0  |

| | Second layer | | Third layer | | Thickness of coating film [µm] | Cutting test 1 Cutting time [min] | Cutting test 2 Cutting length [km] |
|---|---|---|---|---|---|---|---|
| Sample No. | Composition | Thickness [µm] | Composition | Thickness [µm] | | | |
| 1-1  | — | — | — | — | 3.6  | 62  | 4.0 |
| 1-2  | — | — | — | — | 3.3  | 67  | 4.4 |
| 1-3  | — | — | — | — | 3.5  | 65  | 4.2 |
| 1-4  | — | — | — | — | 3.2  | 76  | 5.1 |
| 1-5  | — | — | — | — | 2.4  | 78  | 5.2 |
| 1-6  | — | — | — | — | 4.2  | 79  | 5.1 |
| 1-7  | — | — | — | — | 5.4  | 84  | 5.7 |
| 1-8  | — | — | — | — | 3.6  | 77  | 4.7 |
| 1-9  | — | — | — | — | 3.1  | 68  | 4.3 |
| 1-10 | — | — | — | — | 12.0 | 105 | 7.4 |
| 1-11 | — | — | — | — | 3.0  | 81  | 5.2 |
| 1-12 | — | — | — | — | 4.0  | 85  | 5.6 |
| 1-13 | $Al_{0.65}V_{0.35}N$ | 0.4 | — | — | 4.4 | 80 | 5.1 |
| 1-14 | $Al_{0.73}Cr_{0.28}Ce_{0.05}CN$ | 0.4 | — | — | 7.9 | 98 | 6.3 |
| 1-15 | — | — | $Al_{0.75}Cr_{0.23}Ce_{0.02}CN$ | 0.5 | 3.5 | 92 | 5.9 |
| 1-16 | — | — | — | — | 4.0 | 68 | 4.3 |

TABLE 2

| | First layer | | | | | | | |
|---|---|---|---|---|---|---|---|---|
| | First unit layer $Al_aCr_{1-a-b}Ce_bN$ | | Second unit layer $Al_cV_{1-c}N$ | | | | | |
| Sample No. | a | b | Average thickness [µm] | c | Average thickness [µm] | a − c | λ1/λ2 | Number of layers stacked | Thickness [µm] |
| 1-101 | 0.350 | 0.030 | 0.002 | 0.55 | 0.002 | −0.200 | 1.00 | 900 | 3.6 |
| 1-102 | 0.850 | 0.010 | 0.003 | 0.65 | 0.003 | 0.200  | 1.00 | 600 | 3.6 |
| 1-103 | 0.650 | 0.000 | 0.008 | 0.60 | 0.008 | 0.050  | 1.00 | 200 | 3.2 |
| 1-104 | 0.650 | 0.200 | 0.003 | 0.60 | 0.003 | 0.050  | 1.00 | 400 | 2.4 |
| 1-105 | 0.650 | 0.020 | 0.003 | 0.30 | 0.003 | 0.350  | 1.00 | 450 | 2.7 |
| 1-106 | 0.650 | 0.020 | 0.002 | 0.80 | 0.002 | −0.150 | 1.00 | 800 | 3.2 |
| 1-107 | 0.650 | 0.040 | 0.040 | 0.75 | 0.040 | −0.100 | 1.00 | 40  | 3.2 |
| 1-108 | 0.650 | 0.050 | 3.600 | — | — | — | — | — | 3.6 |
| 1-109 | — | — | — | 0.60 | 4.000 | — | — | — | 4.0 |

| | Second layer | | Third layer | | Thickness of coating film [µm] | Cutting test 1 Cutting time [min] | Cutting test 2 Cutting length [km] |
|---|---|---|---|---|---|---|---|
| Sample No. | Composition | Thickness [µm] | Composition | Thickness [µm] | | | |
| 1-101 | — | — | — | — | 3.6 | 27 | 1.9 |
| 1-102 | — | — | — | — | 3.6 | 24 | 1.7 |
| 1-103 | — | — | — | — | 3.2 | 22 | 1.5 |
| 1-104 | — | — | — | — | 2.4 | 21 | 1.3 |
| 1-105 | — | — | — | — | 2.7 | 26 | 1.8 |
| 1-106 | — | — | — | — | 3.2 | 21 | 1.2 |
| 1-107 | — | — | — | — | 3.2 | 22 | 1.3 |
| 1-108 | — | — | — | — | 3.6 | 20 | 1.1 |
| 1-109 | — | — | — | — | 4.0 | 25 | 1.0 |

<<Evaluation>>

The composition of the first unit layer, the composition of the second unit layer, the composition of the second layer, the composition of the third layer, the number of layers stacked, the average thickness of the first unit layer, the average thickness of the second unit layer, the thickness of the first layer, the thickness of the second layer, the thickness of the third layer, and λ1/λ2 in the cutting tool according to each Sample were measured.

<Measurement of Composition of First Unit Layer>

The composition of the first unit layer in the cutting tool of each Sample was measured by the method described in Embodiment 1, and the values of a and b in $Al_aCr_{1-a-b}Ce_bN$ were obtained. The results are described in the "a" and "b" columns of the "First unit layer" in each of Table 1 and Table 2. A case where "−" is described in the "a" column and the "b" column means no first unit layer is present.

<Measurement of Composition of Second Unit Layer>

The composition of the second unit layer in the cutting tool of each Sample was measured by the method described in Embodiment 1, and the value of c in $Al_cV_{1-c}N$ was obtained. The results are described in the "c" column of the "Second unit layer" in each of Table 1 and Table 2. A case where "−" is described in the "c" column means that no second unit layer is present.

<Measurement of Composition of Second Layer and Composition of Third Layer>

The compositions of the second layer and the third layer in the cutting tool of each Sample were each determined by the method described in Embodiment 1. The results are described in the "Composition" column in the "Second layer" and the "Composition" column in the "Third layer" in each of Table 1 and Table 2. A case where "−" is described in the "Composition" column in the "Second layer" means that no second layer is present, and a case where "−" is described in the "Composition" column in the "Third layer" means that no third layer is present.

<Measurement of Number of Layers Stacked>

The number of layers stacked with respect to each of the first unit layer and the second unit layer in the cutting tool of each Sample was determined by the method described in Embodiment 1. For example, when the number of layers stacked is 10, it is indicated that ten of such first unit layers and ten of such second unit layers are stacked. The results obtained are described in the "Number of layers stacked" column in the "First layer" in each of Table 1 and Table 2.

<Measurement of Average Thickness of First Unit Layer, Average Thickness of Second Unit Layer, Thickness of First Layer, Thickness of Second Layer, and Thickness of Third Layer>

The average thickness of the first unit layer, the average thickness of the second unit layer, the thickness of the first layer, the thickness of the second layer, and the thickness of the third layer in the cutting tool of each Sample were each determined by the method described in Embodiment 1. The results obtained are described in the "Average thickness [μm]" column in the "First unit layer", the "Average thickness [μm]" column in the "Second unit layer", the "Thickness [μm]" column in the "First layer", and the "Thickness [μm]" column in the "Second layer" in each of Table 1 and Table 2. A case where "−" is described in the "Thickness [μ]" column in the "Second layer" of Table 1 and Table 2 means that no second layer is present. A case where "−" is described in the "Thickness [μm]" column in the "Third layer" in each of Table 1 and Table 2 means that no third layer is present.

<Measurement of λ1/λ2>

λ1/λ2 in the cutting tool of each Sample was determined by the method described in Embodiment 1. The results obtained are described in the "λ1/λ2" column in each of Table 1 and Table 2. A case where "−" is described in the "λ1/λ2" column in each of Table 1 and Table 2 means that at least any of the first unit layer and the second unit layer is not present.

<Cutting Test 1: Continuous Turning Test>

The cutting tool having the shape of CNMG120408, according to each Sample, was subjected to a dry continuous turning test under the following cutting conditions, and the time until the amount of wear of the flank face of the cutting edge reached 0.2 mm was measured. The results are shown in the "Cutting time [min]" column in the "Cutting Test 1" in each of Table 1 and Table 2. A longer cutting time indicates a longer tool life.

<<Cutting Conditions>>

Workpiece: SCM440 (HB=300)
Cutting speed: 250 m/min
Feeling speed: 0.3 mm/rev
Depth of Cut: 2 0 mm
Coolant: dry Cutting machining carried out under the cutting conditions is high-speed and high-efficiency machining of a hard-to-cut material, and corresponds to cutting machining to be carried out under a high cutting edge temperature condition.

The cutting tools of Sample 1-1 to Sample 1-16 correspond to Examples, and the cutting tools of Sample 1-101 to Sample 1-109 correspond to Comparative Examples. The cutting tools of Sample 1-1 to Sample 1-16 were each confirmed to have a long tool life in cutting machining carried out under a high cutting edge temperature condition, as compared with the cutting tools of Sample 1-101 to Sample 1-109.

<Cutting Test 2: Milling Test>

Surface milling of the cutting tool of each Sample, having the shape of SEMT13T3AGSN, was carried out under the following cutting conditions with the centerline of a plate composed of a hard-to-cut material, having a width of 150 mm, and the center of a wider cutter of φ160 mm, than the plate, being aligned, and the cutting length until the amount of wear of the flank face of the cutting edge reached 0.2 mm was measured. The results are shown in the "Cutting length [km]" column in the "Cutting Test 2" in each of Table 1 and Table 2. A longer cutting length indicates a longer tool life.

<<Cutting Conditions>>

Workpiece: SKD11 (HB=235)
Cutting speed: 180 m/min
Feeling speed: 0.15 mm/t
Depth of Cut ap in axial direction: 1.5 mm
Depth of Cot ae in radial direction: 150 mm
Coolant: dry Cutting machining carried out under the cutting conditions is milling of a hard-to-cut material under high-speed/high-efficiency and dry conditions, and corresponds to cutting machining to be carried out under a high cutting edge temperature condition.

The cutting tools of Sample 1-1 to Sample 1-16 correspond to Examples, and the cutting tools of Sample 1-101 to Sample 1-109 correspond to Comparative Examples. The cutting tools of Sample 1-I to Sample 1-16 were each confirmed to have a long tool life in cutting machining carried out under a high cutting edge temperature condition, as compared with the cutting tools of Sample 1-101 to Sample 1-100.

Example 2

Sample 2-1 to Sample 2-18, and Sample 2-101 to Sample 2-111

<<Production of Cutting Tool>>

The substrate of each Sample was prepared by the same method as in Example 1. While nitrogen as a reaction gas was introduced in the state of rotation of the substrate at the center and also the temperature of the substrate, the pressure of a reaction gas and the voltage of bias power supply 110 were respectively kept at 500° C. at 2.0 Pa, and at a certain value in the range from −50 V to −200 V, an arc current of 120 A was supplied to each of cathodes 106 and 107, thereby generating metal ions from cathodes 106 and 107, to form a second layer and a first A layer each having a composition shown in Table 3 and Table 4, on the substrate. Herein, the composition of cathode 106 was adjusted so that the composition of the first unit layer as shown in Table 3 and Table 4 was obtained. The composition of cathode 107 was adjusted so that the composition of the third unit layer as shown in Table 3 and Table 4 was obtained.

In the case of formation of the second layer, the first A layer was formed by alternately stacking a first unit layer and a third unit layer one by one on the second layer for the respective numbers of layers stacked as shown in Table 3 and Table 4. In the case of formation of no second layer, the first A layer was formed by alternately stacking a first unit layer and a third unit layer one by one on the substrate for the respective numbers of layers stacked as shown in Table 3 and Table 4. The thickness of the second layer, and the thickness and the number of layers stacked with respect to each of the first unit layer and the third unit layer in the first A layer were adjusted by the rotational rate of the substrate. When the respective thicknesses of the second layer and the first A layer reached the thicknesses as shown in Table 3 and Table 4, the current supplied to a vaporization source was stopped.

Next, while nitrogen and a methane gas as reaction gases were introduced into chamber 101 and also the temperature of the substrate, the pressure of the reaction gases and the voltage of bias power supply 110 were respectively kept at 400° C., at 2.0 Pa, and at −300 V, an arc current of 100 A was supplied to cathode 120, thereby generating a metal ion from cathode 120, to form a third layer on the first A layer. When the thickness of the third layer reached the thickness as shown in Table 3 and Table 4, the current supplied to a vaporization source was stopped. Herein, the composition of cathode 120 was adjusted so that the composition of the third layer as shown in Table 3 and Table 4 was obtained. The amount of nitrogen introduced and the amount of a methane gas introduced were adjusted so that the composition of the third layer as shown in Table 3 and Table 4 was obtained. As described above, the cutting tool of each Sample was produced.

TABLE 3

| | First A layer | | | | | | | | | |
|---|---|---|---|---|---|---|---|---|---|---|
| | First unit layer $Al_aCr_{1-a-b}Ce_bN$ | | | Third unit layer $Al_dV_{1-d-e}M_eN$ | | | | | | |
| Sample No. | a | b | Average thickness [μm] | d | e | M | Average thickness [μm] | a − d | λ1/λ2 | Number of layers stacked | Thickness [μm] |
| 2-1 | 0.450 | 0.020 | 0.001 | 0.40 | 0.03 | Si | 0.005 | 0.050 | 0.2 | 300 | 1.8 |
| 2-2 | 0.800 | 0.020 | 0.300 | 0.70 | 0.03 | Si | 0.050 | 0.100 | 6.0 | 10 | 3.5 |
| 2-3 | 0.700 | 0.030 | 0.005 | 0.65 | 0.02 | B | 0.001 | 0.050 | 5.0 | 600 | 3.6 |
| 2-4 | 0.750 | 0.100 | 0.150 | 0.65 | 0.03 | B | 0.300 | 0.100 | 0.5 | 10 | 4.5 |
| 2-5 | 0.650 | 0.020 | 0.005 | 0.40 | 0.03 | Si | 0.005 | 0.250 | 1.0 | 310 | 3.1 |
| 2-6 | 0.760 | 0.020 | 0.005 | 0.75 | 0.02 | Si | 0.005 | 0.010 | 1.0 | 330 | 3.3 |
| 2-7 | 0.750 | 0.030 | 0.008 | 0.70 | 0.01 | Si | 0.008 | 0.050 | 1.0 | 200 | 3.2 |
| 2-8 | 0.650 | 0.040 | 0.005 | 0.60 | 0.05 | B | 0.005 | 0.050 | 1.0 | 350 | 3.5 |
| 2-9 | 0.700 | 0.020 | 0.003 | 0.70 | 0.02 | Si | 0.003 | 0.000 | 1.0 | 700 | 4.2 |
| 2-10 | 0.700 | 0.020 | 0.025 | 0.65 | 0.01 | B | 0.005 | 0.050 | 5.0 | 100 | 3.0 |
| 2-11 | 0.700 | 0.020 | 0.002 | 0.65 | 0.03 | Si | 0.002 | 0.050 | 1.0 | 1700 | 6.8 |
| 2-12 | 0.650 | 0.020 | 0.200 | 0.60 | 0.03 | Si | 0.200 | 0.050 | 1.0 | 30 | 12.0 |
| 2-13 | 0.700 | 0.020 | 0.005 | 0.65 | 0.02 | Si | 0.002 | 0.050 | 2.5 | 500 | 3.5 |
| 2-14 | 0.650 | 0.020 | 0.200 | 0.60 | 0.03 | B | 0.200 | 0.050 | 1.0 | 10 | 4.0 |
| 2-15 | 0.650 | 0.050 | 0.005 | 0.60 | 0.03 | Si | 0.005 | 0.050 | 1.0 | 300 | 3.0 |
| 2-16 | 0.800 | 0.080 | 0.010 | 0.75 | 0.02 | Si | 0.010 | 0.050 | 1.0 | 150 | 3.0 |

| Sample No. | Second layer Composition | Second layer Thickness [μm] | Third layer Composition | Third layer Thickness [μm] | Thickness of coating film [μm] | Cutting test 3 Cutting time [min] | Cutting test 4 Cutting length [km] |
|---|---|---|---|---|---|---|---|
| 2-1 | — | — | — | — | 1.8 | 76 | 4.5 |
| 2-2 | — | — | — | — | 3.5 | 75 | 4.4 |
| 2-3 | — | — | — | — | 3.6 | 72 | 4.3 |
| 2-4 | — | — | — | — | 4.5 | 70 | 4.1 |
| 2-5 | — | — | — | — | 3.1 | 82 | 6.6 |
| 2-6 | — | — | — | — | 3.3 | 84 | 6.7 |
| 2-7 | — | — | — | — | 3.2 | 81 | 5.9 |
| 2-8 | — | — | — | — | 3.5 | 83 | 6.8 |
| 2-9 | — | — | — | — | 4.2 | 86 | 6.9 |
| 2-10 | — | — | — | — | 3.0 | 82 | 6.2 |
| 2-11 | — | — | — | — | 6.8 | 94 | 7.1 |

TABLE 3-continued

| Sample | | | | | | | |
|---|---|---|---|---|---|---|---|
| 2-12 | — | — | — | — | 12.0 | 104 | 7.3 |
| 2-13 | — | — | — | — | 3.5 | 82 | 6.8 |
| 2-14 | — | — | — | — | 4.0 | 85 | 6.4 |
| 2-15 | $Al_{0.65}Cr_{0.30}Ce_{0.05}CN$ | 0.5 | — | — | 3.5 | 94 | 6.8 |
| 2-16 | $Al_{0.80}Cr_{0.12}Ce_{0.08}CN$ | 0.5 | — | — | 3.5 | 95 | 6.9 |

TABLE 4

| | First A layer | | | | | | | | | | |
|---|---|---|---|---|---|---|---|---|---|---|---|
| | First unit layer $Al_aCr_{1-a-b}Ce_bN$ | | | Third unit layer $Al_dV_{1-d-e}M_eN$ | | | | | | | |
| Sample No. | a | b | Average thickness [μm] | d | e | M | Average thickness [μm] | a − d | λ1/λ2 | Number of layers stacked | Thickness [μm] |
| 2-17 | 0.680 | 0.020 | 0.005 | 0.67 | 0.03 | Si | 0.005 | 0.010 | 1 | 320 | 3.2 |
| 2-18 | 0.680 | 0.020 | 0.005 | 0.67 | 0.03 | B | 0.005 | 0.010 | 1 | 340 | 3.4 |
| 2-101 | 0.300 | 0.030 | 0.040 | 0.70 | 0.03 | Si | 0.040 | −0.400 | 1 | 30 | 2.4 |
| 2-102 | 0.850 | 0.030 | 0.030 | 0.70 | 0.03 | Si | 0.030 | 0.150 | 1 | 50 | 3.0 |
| 2-103 | 0.650 | 0.000 | 0.090 | 0.70 | 0.02 | Si | 0.090 | −0.050 | 1 | 20 | 3.6 |
| 2-104 | 0.650 | 0.000 | 0.050 | 0.70 | 0.03 | B | 0.050 | −0.050 | 1 | 30 | 3.0 |
| 2-105 | 0.650 | 0.200 | 0.050 | 0.70 | 0.03 | B | 0.050 | −0.050 | 1 | 30 | 3.0 |
| 2-106 | 0.650 | 0.020 | 0.050 | 0.30 | 0.02 | B | 0.050 | 0.350 | 1 | 33 | 3.3 |
| 2-107 | 0.650 | 0.020 | 0.050 | 0.80 | 0.02 | Si | 0.050 | −0.150 | 1 | 35 | 3.5 |
| 2-108 | 0.650 | 0.020 | 0.050 | 0.65 | 0.00 | — | 0.050 | 0.000 | 1 | 30 | 3.0 |
| 2-109 | 0.650 | 0.020 | 0.050 | 0.65 | 0.10 | B | 0.050 | 0.000 | 1 | 36 | 3.6 |
| 2-110 | 0.650 | 0.020 | 0.050 | 0.65 | 0.02 | B | 0.050 | 0.000 | 1 | 30 | 3.0 |
| 2-111 | 0.650 | 0.020 | 3.500 | — | — | — | — | — | — | — | 3.5 |

| | Second layer | | Third layer | | Thickness of coating film [μm] | Cutting test 3 Cutting time [min] | Cutting test 4 Cutting length [km] |
|---|---|---|---|---|---|---|---|
| Sample No. | Composition | Thickness [μm] | Composition | Thickness [μm] | | | |
| 2-17 | $Al_{0.67}V_{0.30}Si_{0.03}N$ | 0.5 | $Al_{0.68}Cr_{0.30}Ce_{0.02}CN$ | 0.6 | 4.3 | 96 | 6.6 |
| 2-18 | — | — | $Al_{0.68}Cr_{0.30}Ce_{0.02}CN$ | 0.4 | 3.8 | 96 | 7.2 |
| 2-101 | — | — | — | — | 2.4 | 28 | 1.8 |
| 2-102 | — | — | — | — | 3.0 | 30 | 2.0 |
| 2-103 | — | — | — | — | 3.6 | 25 | 1.6 |
| 2-104 | — | — | — | — | 3.0 | 24 | 1.5 |
| 2-105 | — | — | — | — | 3.0 | 22 | 1.4 |
| 2-106 | — | — | — | — | 3.3 | 29 | 1.7 |
| 2-107 | — | — | — | — | 3.5 | 21 | 1.3 |
| 2-108 | — | — | — | — | 3.0 | 27 | 1.5 |
| 2-109 | — | — | — | — | 3.6 | 30 | 1.9 |
| 2-110 | — | — | — | — | 3.0 | 26 | 1.6 |
| 2-111 | — | — | — | — | 3.5 | 20 | 1.2 |

<<Evaluation>>

The cutting tool according to each Sample was subjected to measurement of the composition of the first unit layer, the composition of the third unit layer, the composition of the second layer, the composition of the third layer, the number of layers stacked, the average thickness of the first unit layer, the average thickness of the third unit layer, the thickness of the first A layer, the thickness of the second layer, the thickness of the third layer, and λ1/λ3. The measurement methods of the respective items are as described in Example 1. The results are shown in Table 3 and Table 4.

<Cutting Test 3: Continuous Turning Test>

The cutting tool having the shape of CNMG120408, according to each Sample, was subjected to a dry continuous turning test under the following cutting conditions, and the time until the amount of wear of the flank face of the cutting edge reached 0.2 mm was measured. The results are shown in the "Cutting time [min]" column in the "Cutting Test 3" in each of Table 3 and Table 4. In Table 3 and Table 4, a longer cutting time indicates a longer tool life.

(Cutting Conditions)
Workpiece: Inconel 718 (aging material: HB=400)
Cutting speed: 65 m/min
Feeding speed: 0.15 mm/rev
Depth of Cu: 1.0 mm
Coolant: dry Cutting machining carried out under the cutting conditions is high-speed and high-efficiency machining of a hard-to-cut material, and corresponds to cutting machining to be carried out under a high cutting edge temperature condition.

The cutting tools of Sample 2-1 to Sample 2-18 correspond to Examples, and the cutting tools of Sample 2-101 to Sample 2-111 correspond to Comparative Examples. The cutting tools of Sample 2-1 to Sample 2-18 were each confirmed to have a long tool life in cutting machining carried out under a high cutting edge temperature condition, as compared with the cutting tools of Sample 2-101 to Sample 2-111.

<Cutting Text 4: Milling Test>

Surface milling of the cutting tool of each Sample, having the shape of SEMT13T3AGSN, was carried out under the following cutting conditions with the centerline of a plate composed of a hard-to-cut material, having a width of 150 mm, and the center of a wider cutter of φ160 mm, than the plate, being aligned, and the cutting length until the amount of wear of the flank face of the cutting edge reached 0.2 mm was measured. The results are shown in the "Cutting length [km]" column in the "Cutting Test 4" in each of Table 3 and Table 4. In Table 3 and Table 4, a longer cutting length indicates a longer tool life.

<<Cutting Conditions>>

Workpiece: FCD700 (HB=250)
Cutting speed: 250 m/min
Feeding speed: 0.2 mm/t
Depth of Cut ap in axial direction: 2.0 mm
Depth of Cut ae in radial direction: 150 mm
Coolant: dry Cutting machining carried out under the cutting conditions is milling of a hard-to-cut material under high-speed/high-efficiency and dry conditions, and corresponds to cutting machining to be carried out under a high cutting edge temperature condition.

The cutting tools of Sample 2-1 to Sample 2-18 correspond to Examples, and the cutting tools of Sample 2-101 to Sample 2-111 correspond to Comparative Examples. The cutting tools of Sample 2-1 to Sample 2-18 were each confirmed to have a long tool life in cutting machining carried out under a high cutting edge temperature condition, as compared with the cutting tools of Sample 2-101 to Sample 2-111.

While embodiments and Examples of the present disclosure are described as above, it is also expected from the beginning that the respective configurations of embodiments and Examples described above are appropriately combined and/or variously modified.

Embodiments and Examples here disclosed are illustrative in every regard and are to be considered not to be limitative. The scope of the present invention is indicated by not embodiments and Examples described above, but claims, and it is meant that all modifications falling within the meanings and scopes equivalent to claims are encompassed.

REFERENCE SIGNS LIST

1 cutting tool, 2 substrate, 3 coating film, 12 first unit layer, 13 first layer, 13A first A layer, 14 third unit layer, 15 second unit layer, 16 second layer, 17 third unit layer, 101 chamber, 103 gas exhaust, 104 substrate holder, 105 gas, 106, 107, 120 cathode, 108, 109 are power supply, 110 bias power supply.

The invention claimed is:

1. A cutting tool comprising a substrate and a coating film disposed on the substrate, wherein
the coating film includes a first layer,
the first layer is composed of an alternating layer where a first unit layer and a second unit layer are alternately stacked,
the first unit layer is composed of $Al_aCr_{1-a-b}Ce_bN$,
a is more than 0.400 and 0.800 or less,
b is 0.001 or more and 0.100 or less,
the second unit layer is composed of $Al_cV_{1-c}N$,
c is 0.40 or more and 0.75 or less, and
a and c satisfy a relationship of a>c.

2. The cutting tool according to claim 1, wherein, in the first unit layer and the second unit layer adjacent to the first unit layer, a ratio $\lambda 1/\lambda 2$ of a thickness $\lambda 1$ of the first unit layer to a thickness $\lambda 2$ of the second unit layer is 1.0 or more and 5.0 or less.

3. The cutting tool according to claim 1, wherein
an average thickness of the first unit layer is 0.002 μm or more and 0.2 μm or less, and
an average thickness of the second unit layer is 0.002 μm or more and 0.2 μm or less.

4. The cutting tool according to claim 1, wherein
the coating film further includes a second layer disposed between the substrate and the first layer, and
a composition of the second layer is the same as a composition of the first unit layer or a composition of the second unit layer.

5. The cutting tool according to claim 4, wherein
the composition of the second layer is the same as the composition of the first unit layer, and
a thickness of the second layer is larger than a thickness of the first unit layer.

6. The cutting tool according to claim 4, wherein
the composition of the second layer is the same as the composition of the second unit layer, and
a thickness of the second layer is larger than a thickness of the second unit layer.

7. The cutting tool according to claim 1, wherein
the coating film further includes a third layer provided on the first layer opposite to the substrate, and
the third layer is composed of AlCrCeCN.

8. A cutting tool comprising a substrate and a coating film disposed on the substrate, wherein
the coating film includes a first A layer,
the first A layer is composed of an alternating layer where a first unit layer and a third unit layer are alternately stacked,
the first unit layer is composed of $Al_aCr_{1-a-b}Ce_bN$,
a is more than 0.400 and 0.800 or less,
b is 0.001 or more and 0.100 or less,
the third unit layer is composed of $Al_dV_{1-d-e}M_eN$,
M is silicon or boron,
d is 0.40 or more and 0.75 or less,
e is more than 0 and 0.05 or less, and
a and d satisfy a relationship of a>d.

9. The cutting tool according to claim 8, wherein, in the first unit layer and the third unit layer adjacent to the first unit layer, a ratio $\lambda 1/\lambda 3$ of a thickness $\lambda 1$ of the first unit layer to a thickness $\lambda 3$ of the third unit layer is 1.0 or more and 5.0 or less.

10. The cutting tool according to claim 8, wherein M is silicon.

11. The cutting tool according to claim 8, wherein M is boron.

12. The cutting tool according to claim 8, wherein
an average thickness of the first unit layer is 0.002 μm or more and 0.2 μm or less, and
an average thickness of the third unit layer is 0.002 μm or more and 0.2 μm or less.

13. The cutting tool according to claim 8, wherein
the coating film further includes a second layer disposed between the substrate and the first A layer, and
a composition of the second layer is the same as a composition of the first unit layer or a composition of the third unit layer.

14. The cutting tool according to claim 13, wherein
the composition of the second layer is the same as the composition of the first unit layer, and
a thickness of the second layer is larger than a thickness of the first unit layer.

15. The cutting tool according to claim 13, wherein
the composition of the second layer is the same as the composition of the third unit layer, and
a thickness of the second layer is larger than a thickness of the third unit layer.

16. The cutting tool according to claim 8, wherein
the coating film further includes a third layer provided on the first A layer opposite to the substrate, and
the third layer is composed of AlCrCeCN.

* * * * *